(12) United States Patent
Motofuji et al.

(10) Patent No.: US 8,853,290 B2
(45) Date of Patent: Oct. 7, 2014

(54) PHOTOSENSITIVE COMPOSITION

(75) Inventors: Shihei Motofuji, Kyoto (JP); Shintaro Higuchi, Kyoto (JP); Atsushi Shiraishi, Kyoto (JP); Takao Mukai, Kyoto (JP); Megumu Sakakibara, Kyoto (JP)

(73) Assignee: Sanyo Chemical Industries, Ltd., Kyoto-shi (JP)

( * ) Notice: Subject to any disclaimer, the term of this patent is extended or adjusted under 35 U.S.C. 154(b) by 200 days.

(21) Appl. No.: 13/376,951

(22) PCT Filed: Jun. 1, 2010

(86) PCT No.: PCT/JP2010/059266
§ 371 (c)(1),
(2), (4) Date: Feb. 22, 2012

(87) PCT Pub. No.: WO2010/143560
PCT Pub. Date: Dec. 16, 2010

(65) Prior Publication Data
US 2012/0142806 A1    Jun. 7, 2012

(30) Foreign Application Priority Data

| Jun. 8, 2009 | (JP) | 2009-137001 |
| Jun. 23, 2009 | (JP) | 2009-148446 |
| Oct. 30, 2009 | (JP) | 2009-250743 |
| Nov. 18, 2009 | (JP) | 2009-262551 |
| Nov. 26, 2009 | (JP) | 2009-268340 |
| Feb. 5, 2010 | (JP) | 2010-024481 |
| Feb. 18, 2010 | (JP) | 2010-033085 |
| Mar. 24, 2010 | (JP) | 2010-068952 |

(51) Int. Cl.
*C08F 2/46* (2006.01)
*C08G 61/04* (2006.01)
*G03F 7/029* (2006.01)
*C08F 2/50* (2006.01)
*C08G 59/68* (2006.01)
*G03F 7/004* (2006.01)
*C08F 222/10* (2006.01)

(52) U.S. Cl.
CPC .............. *C08G 59/68* (2013.01); *G03F 7/0046* (2013.01); *C08F 222/1006* (2013.01); *G03F 7/029* (2013.01); *C08F 2/50* (2013.01); *G03F 7/0047* (2013.01)
USPC .................................................. 522/1; 520/1

(58) Field of Classification Search
USPC .................................................. 522/1; 520/1
See application file for complete search history.

(56) References Cited

U.S. PATENT DOCUMENTS

2007/0228614 A1   10/2007   Ren et al.

FOREIGN PATENT DOCUMENTS

| CN | 1209570 A | 3/1999 |
| CN | 1268680 A | 10/2000 |
| CN | 1892425 A | 1/2007 |
| CN | 101281369 A | 10/2008 |
| CN | 101384958 A | 3/2009 |
| JP | 2-166451 A | 6/1990 |
| JP | 11-258790 A | 9/1999 |
| JP | 2006-249040 | * 9/2006 |
| JP | 2006-10094111 | 1/2007 |
| JP | 2007-017458 A | 1/2007 |
| JP | 2007-101685 | * 4/2007 |
| JP | 2009-019142 A | 1/2009 |
| JP | 2009-520819 A | 5/2009 |
| WO | 2007/075663 A1 | 7/2007 |
| WO | 2007/112921 A1 | 10/2007 |

OTHER PUBLICATIONS

International Search Report of PCT/JP2010/059266, mailing date Sep. 7, 2010.

* cited by examiner

*Primary Examiner* — Ling Choi
*Assistant Examiner* — Jessica E Whiteley
(74) *Attorney, Agent, or Firm* — Westerman, Hattori, Daniels & Adrian, LLP

(57) ABSTRACT

Provided is a photosensitive composition which can be cured with low energy consumption, even when a substance (such as a colorant) that attenuates or shades an illumination light is contained in a high concentration or even when the photosensitive composition is in the form of a thick film. Specifically provided is a photosensitive composition which comprises the following four components: (1) a radical initiator (A); (2) an acid generator (B) or a base generator (C); (3) a polymerizable substance (D); and (4) a colorant (E), a metal oxide powder (F), or a metal powder (G). Further, the photosensitive composition is characterized in that the radical initiator (A), the acid generator (B), and/or the base generator (C) generates an active species (H) through irradiation with an active ray of light; the active species (H) reacts the radical initiator (A), the acid generator (B), or the base generator (C) to form another species (I); and thus the polymerization of the polymerizable substance (D) by means of the active species (I) proceeds, said active species (H) or (I) being an acid or a base.

18 Claims, No Drawings

PHOTOSENSITIVE COMPOSITION

TECHNICAL FIELD

The present invention relates to a composition that is cured by exposure to light.

So-called "UV coating", which is a surface coating treatment involving curing by exposure to light, has been widening its application to coating materials, paints, printing inks, and the like, because of its efficiency (quick curing performance) and VOC reduction performance.

Common photocurable coating materials contain photopolymerization initiators, and radical polymerizable monomers, oligomers or polymers, and optionally contain colorants and additives according to their intended use. Colorants are roughly classified into pigments and dyes, and the purpose of their use is to provide a colored coating. Colorants have light absorption properties according to their color and cause emitted light to be partially absorbed and attenuated or to be blocked. As a result, the light may fail to reach a sufficient depth in a coating. As a method for solving this problem, the use of a specific photopolymerization initiator was proposed (for example, Patent Document 1).

The invention of Patent Document 1 is the use of a photopolymerization initiator having a specific structure and a sensitizer together. Although this invention has an improvement that the energy dose required for curing can be reduced compared to systems including a conventional photopolymerization initiator, the curing performance is problematically insufficient in the case of ink compositions that contain colorants at high concentrations or in the case of thick coatings.
Patent Document 1: JP 2009-19142 A

SUMMARY OF THE INVENTION

Problems to be Solved by the Invention

The present invention was made in view of the above problem and aims to provide a photosensitive composition that is cured by a small amount of energy even in the case where the composition contains a high concentration of a colorant or the like substance that causes emitted light to be attenuated or to be blocked or where a thick coating is formed.

Means for Solving the Problems

The present inventors intensively studied to achieve the above object and developed the present invention. Specifically, the present invention provides a photosensitive composition which includes:
(1) a radical initiator (A);
(2) an acid generator (B) or a base generator (C);
(3) a polymerizable substance (D); and
(4) a colorant (E), a metal oxide powder (F), or a metal powder (G).

At least one of the radical initiator (A), the acid generator (B), and the base generator (C) generates an active species (H) on exposure to active rays, and the active species (H) reacts with the radical initiator (A), the acid generator (B), or the base generator (C) to generate another active species (I). The active species (I) in turn causes the polymerizable substance (D) to be polymerized. The active species (H) or (I) is an acid or a base.

The term "active rays" herein refers to rays in the wavelength range of 360 nm to 830 nm.

Effects of the Invention

The photosensitive composition of the present invention enables thick coatings to be cured by a small amount of energy even if a colorant or the like substance that attenuates or blocks emitted light is present at a high concentration.

In the case where a metal oxide powder or a metal powder is used as a substance that attenuates or blocks emitted light, a green sheet and an electrode layer for a ceramic electronic device can be formed in a short time by exposure to light.

MODES FOR CARRYING OUT THE INVENTION

The photosensitive composition of the present invention contains:
(1) a radical initiator (A);
(2) an acid generator (B) or a base generator (C);
(3) a polymerizable substance (D); and
(4) a colorant (E), a metal oxide powder (F), or a metal powder (G).

In the photosensitive composition of the present invention, at least one of the radical initiator (A), the acid generator (B), and the base generator (C) generates an active species (H) on exposure to active rays. The active species (H) reacts with the radical initiator (A), the acid generator (B), or the base generator (C) to generate another active species (I), and the active species (I) in turn causes the polymerizable substance (D) to be polymerized. Examples of the active species (H) and (I) include radicals, acids, bases, and the like. However, either the active species (H) or (I) generated in the above reactions should be an acid or base. Photocuring of parts which attenuated active rays reach or which light does not reach is difficult with the use of common photopolymerization initiators. However, as the active species (H) diffuses, the photosensitive composition enables such parts to be cured. In order to allow the active species (H) to diffuse, the polymerizable substance (D) preferably does not react with the active species (H).

In the case where the active species (H) is an acid, the active species (I) should not be a base. In the case where the active species (H) is a base, the active species (I) should not be an acid.

In the case of cationic polymerization with the use of a single common acid generator or anionic polymerization with the use of a single common base generator, it is difficult to make use of light of wavelengths outside the absorption range of the generator. In the present invention, however, the use of light of wavelengths outside the absorption range of a photoacid generator or a photobase generator is enabled by using a radical generator that can absorb light of wavelengths outside the absorption range together.

In the present invention, the radical initiator (A) refers to a compound that generates radicals on exposure to active rays, an acid, or a base, and may be a known compound such as a radical initiator (A1) that generates radicals on exposure to active rays, a radical initiator (A2) that generates radicals on exposure to an acid, and a radical initiator (A3) that generates radicals on exposure to a base.

For example, acylphosphine oxide derivative-based polymerization initiators (A1231), α-aminoacetophenone derivative-based polymerization initiators (A1232), benzyl ketal derivative-based polymerization initiators (A1233), α-hydroxyacetophenone derivative-based polymerization initiators (A1234), benzoin derivative-based polymerization initiators (A1235), oxime ester derivative-based polymerization initiators (A1236), and titanocene derivative-based polymerization initiators (A1237) all generate radicals on exposure to any of active rays, acids, and bases, and therefore any of these can be used as any of (A1), (A2), and (A3).

For example, organic peroxide-based polymerization initiators (A231), azo-based polymerization initiators (A232), and other radical initiators (A233) all generate radicals on exposure to either an acid or a base, and therefore any of these can be used as both of (A2) and (A3).

(A) may be a single compound or may be a combination of two or more compounds.

(A1231) indicates that this compound is the first example of initiators that can be used as any of (A1), (A2), and (A3). Similarly, (A231) indicates that this compound is the first example of initiators that can be used as both of (A2) and (A3).

Examples of the acylphosphine oxide derivative-based polymerization initiators (A1231) include 2,4,6-trimethyl-benzoyl-diphenylphosphine oxide [product of Ciba Japan K.K. (DAROCUR TPO)] and bis(2,4,6-trimethylbenzoyl)-phenylphosphine oxide [product of Ciba Japan K.K. (IRGACUR 819)].

Examples of the α-aminoacetophenone derivative-based polymerization initiators (A1232) include 2-methyl-1-(4-methylthiophenyl)-2-morpholinopropane-1-on [product of Ciba Japan K.K. (IRGACUR 907)], 2-benzyl-2-dimethylamino-1-(4-morpholinophenyl)butanone [product of Ciba Japan K.K. (IRGACUR 369)], and 1,2-(dimethylamino)-2-[(4-methylphenyl)methyl]-1-[4-(4-morpholinyl)phenyl]-1-butanone [product of Ciba Japan K.K. (IRGACUR 379)].

Examples of the benzyl ketal derivative-based polymerization initiators (A1233) include 2,2-dimethoxy-1,2-diphenylethane-1-on [product of Ciba Japan K.K. (IRGACUR 651)].

Examples of the α-hydroxyacetophenone derivative-based polymerization initiators (A1234) include 1-hydroxy-cyclohexyl-phenyl-ketone [product of Ciba Japan K.K. (IRGACUR 184)], 2-hydroxy-2-methyl-1-phenyl-propane-1-on [product of Ciba Japan K.K. (DAROCUR 1173)], 1-[4-(2-hydroxyethoxy)-phenyl]-2-hydroxy-2-methyl-1-propane-1-on [product of Ciba Japan K.K. (IRGACUR 2959)], and 2-hydroxy-1-{4-[4-(2-hydroxy-2-methyl-propionyl)-benzyl]phenyl}-2-methyl-propane-1-on [product of Ciba Japan K.K. (IRGACUR 127)].

Examples of the benzoin derivative-based polymerization initiators (A1235) include benzoin methyl ether, benzoin ethyl ether, and benzoin isopropyl ether.

Examples of the oxime ester derivative-based polymerization initiators (A1236) include 1,2-octanedione-1-[(4-(phenylthio)-2-(O-benzoyloxime)] [product of Ciba Japan K.K. (IRGACURE OXE 01)] and ethanone-1-(9-ethyl-6-(2-methylbenzoyl)-9H-carbazole-3-yl]-1-(0-acetyloxime) [product of Ciba Japan K.K. (IRGACURE OXE 02)].

Examples of the titanocene derivative-based polymerization initiators (A1237) include bis(η5-2,4-cyclopentadiene-1-yl)-bis(2,6-difluoro-3-(1H-pyrrole-1-yl)-phenyl)titanium [product of Ciba Japan K.K. (IRGACUR 784)].

Examples of the organic peroxide-based polymerization initiators (A231) include benzoyl peroxide, t-butyl peroxyacetate, 2,2-di-(t-butylperoxy)butane, t-butyl peroxybenzoate, n-butyl 4,4-di(t-butylperoxy)valerate, di(2-t-butyl peroxyisopropyl)benzene, dicumylperoxide, di-t-hexylperoxide, 2,5-dimethyl-2,5-di(t-butylperoxy)hexane, t-butylcumyl peroxide, di-t-butyl peroxide, diisopropylbenzene hydroperoxide, p-menthane hydroperoxide, 1,1,3,3-tetramethylbutyl hydroperoxide, cumen hydroperoxide, t-butyl hydroperoxide, and t-butyl trimethylsilyl peroxide.

Examples of the azo-based polymerization initiators (A232) include 1-[(1-cyano-1-methylethyl)azo]formamide, 2,2'-azobis(N-butyl-2-methylpropionamide), 2,2'-azobis(N-cyclohexyl-2-methylpropionamide), and 2,2'-azobis(2,4,4-trimethylpentane).

Examples of other polymerizable initiators (A233) include 2,3-dimethyl-2,3-diphenylbutane.

Preferred examples of the radical initiator (A2) that generates radicals on exposure to an acid and the radical initiator (A3) that generates radicals on exposure to a base include the organic peroxide-based polymerization initiators (A231) and/or azo-based polymerization initiators (A232).

In terms of the photocurability, the amount of the radical polymerization initiator (A) is preferably 0.05 to 30% by weight, and more preferably 0.1 to 20% by weight of the polymerizable substance (D).

In the present invention, the acid generator (B) refers to a compound that generates an acid on exposure to active rays, radicals or an acid, and examples thereof include known compounds such as acid generators (B1) that generate an acid on exposure to active rays, acid generators (B2) that generate an acid on exposure to radicals, and acid generators (B3) that generate an acid on exposure to an acid.

For example, sulfonium salt derivatives (B121) and iodonium salt derivatives (B122) both generate an acid on exposure to either active rays or radicals, and therefore any of these can be used as both of (B1) and (B2).

For example, sulfonic acid ester derivatives (B31), acetic acid ester derivatives (B32), and phosphonic acid esters (B33) all generate an acid on exposure to an acid, and therefore any of these can be used as (B3).

(B) may be a single compound or may be a combination of two or more compounds.

Examples of the sulfonium salt derivatives (B121) in the present invention include compounds represented by the following formula (1) or (2).

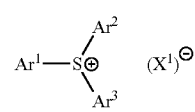

(1)

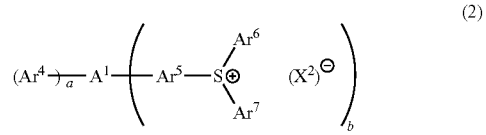

(2)

In the formulas (1) and (2), $A^1$ is a divalent or trivalent group represented by any one of the following formulas (3) to (10); $Ar^1$ to $Ar^7$ are individually an aromatic hydrocarbon or heterocyclic group with at least one benzene ring, and are optionally substituted by at least one atom or substituent selected from the group consisting of halogens, and C1-C20 acyl, C1-C20 alkyl, C1-C20 alkoxy, C1-C20 alkylthio, C1-C20 alkylsilyl, nitro, carboxyl, hydroxyl, mercapto, amino, cyano, phenyl, naphthyl, phenoxy, and phenylthio groups; $Ar^1$ to $Ar^4$, $Ar^4$, and $Ar^7$ are each a monovalent group, and $Ar^1$ is a divalent group; $(X^1)^-$ and $(X^2)^{-1}$ are each a negative ion; and a is an integer of 0 to 2, b is an integer of 1 to 3, and (a+b) is 2 or 3 and is the same as the valence of $A^1$.

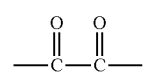

(3)

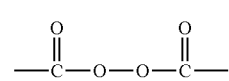

(4)

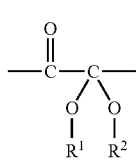

(5)

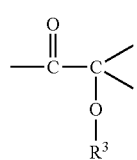

(6)

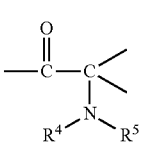

(7)

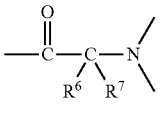

(8)

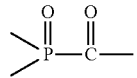

(9)

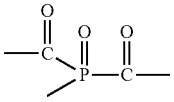

(10)

$R^1$ to $R^7$ in the formulas (5) to (8) are individually a hydrogen, a C1-C20 alkyl group, or a phenyl group optionally substituted by at least one atom or substituent selected from the group consisting of halogens, and C1-C20 acyl, C1-C20 alkyl, amino, cyano, phenyl, naphthyl, phenoxy, and phenylthio groups; and $R^1$, $R^4$, and $R^6$ may optionally link to $R^2$, $R^5$, and $R^7$, respectively, to form a ring structure.

In terms of the efficiency of acid generation, $A^1$ in the formula (2) is preferably a group represented by any one of the formulas (7) to (10), and more preferably a group represented by any one of the formulas (5) and (8) to (10).

$Ar^1$ to $Ar^7$ in the formulas (1) and (2) are groups that absorb light of wavelengths within the ultraviolet to visible range.

$Ar^1$ to $Ar^7$ preferably contain 1 to 5 benzene rings and more preferably 1 to 4 benzene rings.

Examples of ones containing one benzene ring include residues of benzene and heterocyclic compounds in which one or two hydrogen atoms are removed. Specific examples of the heterocyclic compounds include benzofran, benzothiophene, indore, quinoline, and coumarin.

Examples of ones containing two benzene rings include residues of naphthalene, biphenyl, fluorene, and heterocyclic compounds in which one or two hydrogen atoms are removed. Specific examples of the heterocyclic compounds include dibenzofuran, dibenzothiophene, xanthone, xanthene, thioxanthone, acridine, phenothiazine, and thianthrene.

Examples of ones containing three benzene rings include residues of anthracene, phenanthrene, terphenyl, and heterocyclic compounds in which one or two hydrogen atoms are removed. Specific examples of the heterocyclic compounds include p-(thioxanthylmercapto)benzene and naphthobenzothiophene.

Examples of ones containing four benzene rings include naphthacene, pyrene, benzoanthracene, and triphenylene residues in which one or two hydrogen atoms are removed.

Examples of halogens include fluorine, chlorine, bromine, and iodine. Fluorine and chlorine are preferred.

Examples of C1-C20 acyl groups include formyl, acetyl, propionyl, isobutyryl, valeryl, and cyclohexyl carbonyl groups.

Examples of C1-C20 alkyl groups include methyl, ethyl, n- or iso-propyl, n-, sec- or tert-butyl, n-, iso- or neo-pentyl, hexyl, heptyl, and octyl groups.

Examples of C1-C20 alkoxy groups include methoxy, ethoxy, n- or iso-propoxy, n-, sec- or tert-butoxy, n-, iso- or neo-pentyloxy, hexyloxy, heptyloxy, and octyloxy groups.

Examples of C1-C20 alkylthio groups include methylthio, ethylthio, n- or iso-propylthio, n-, sec- or tert-butylthio, n-, iso- or neo-pentylthio, hexylthio, heptylthio, and octylthio groups.

Examples of C1-C20 alkylsilyl groups include trialkylsilyl groups such as trimethylsilyl and triisopropylsilyl groups. The alkyl chains of these groups may be straight or branched.

Examples of substituent atoms and groups for substitution of $Ar^1$ to $Ar^7$ include halogens, and cyano, phenyl, naphthyl, phenoxy, phenylthio, C1-C20 alkyl, C1-C20 alkoxy, C1-C20 alkylthio, and C1-C20 acyl groups. These are preferred in terms of the efficiency of acid generation. Cyano, phenyl, C1-C15 alkyl, C1-C15 alkoxy, C1-C15 alkylthio, and C1-C15 acyl groups are more preferred, and C1-C10 alkyl, C1-C10 alkoxy, C1-C10 alkylthio, and C1-C10 acyl groups are particularly preferred. The alkyl chains of these groups may be straight or branched.

Preferably, $Ar^1$ to $Ar^4$, $Ar^6$ and $Ar^7$ are individually a phenyl, p-methylphenyl, p-methoxyphenyl, p-tert-butylphenyl, 2,4,6-trimethylphenyl, p-(thioxanthylmercapto)phenyl, or m-chlorophenyl group in terms of the efficiency of acid generation.

In terms of the efficiency of acid generation, $Ar^5$ is preferably a phenylene, 2- or 3-methylphenylene, 2- or 3-methoxyphenylene, 2- or 3-butylphenylene, or 2- or 3-chlorophenylene group.

Examples of negative ions for $(X^1)^-$ and $(X^2)^-$ in the formulas (1) and (2) include halide anions; hydroxide anions; thiocyanate anions; C1-C4 dialkyldithio carbamate anions; carbonate anions; bicarbonate anions; aliphatic or aromatic carboxyl anions (e.g. benzoic acid anion, trifluoroacetic acid anion, perfluoroalkyl acetate anions, phenylglyoxylic acid anion) which are optionally substituted by halogen(s); aliphatic or aromatic sulfoxy anions (e.g. trifluoromethanesulfonic acid anion) which are optionally substituted by halogen(s); hexafluoro antimonate anion ($SbF_6^-$); phosphine anions [e.g. hexafluoro phosphine anion ($PF_6^-$); trifluoro tris (perfluoroethyl)phosphine anion ($PF_3(C_2F_5)_3^-$)]; and borate anions (e.g. tetraphenyl borate, butyltriphenyl borate anion). In terms of the efficiency of acid generation, phosphine anions, aliphatic sulfoxy ions substituted by halogen(s), and borate anions are preferred.

Examples of the sulfonium salt derivatives (B121) include compounds having a cationic structure such as a triphenylsulfonium cation structure, a tri-p-tolylsulfonium cation structure, and a [p-(phenylmercapto)phenyl]diphenyl sulfonium cation structure; and compounds represented by the formulas (11) to (14). They are preferred in terms of the efficiency of acid generation. Compounds represented by the following formulas (11) to (14) are more preferred.

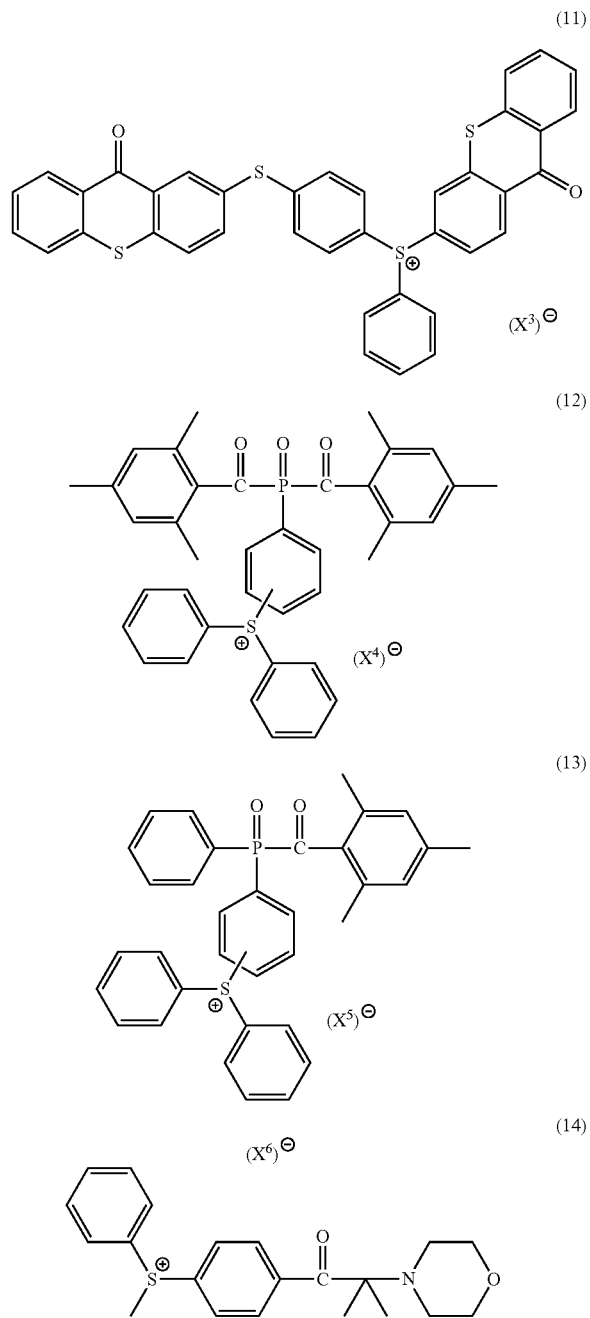

($X^3$)⁻ to ($X^6$)⁻ in the formulas (11) to (14) are each a negative ion, and specific examples and preferred examples thereof are those listed above for ($X^1$)⁻ and ($X^2$)⁻ in the formulas (1) and (2).

Examples of the iodonium salt derivatives (B122) in the present invention include those represented by the following formulas (15) and (16).

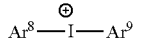

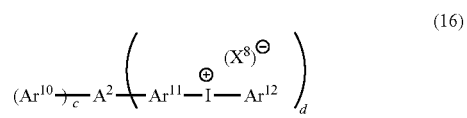

In the formulas, $A^2$ is a divalent or trivalent group represented by any one of the above formulas (3) to (10); $Ar^8$ to $Ar^{12}$ are individually an aromatic hydrocarbon or heterocyclic group with at least one benzene ring, and are optionally substituted by at least one substituent selected from the group consisting of halogens, and C1-C20 acyl, C1-C20 alkyl, C1-C20 alkoxy, C1-C20 alkylthio, C1-C20 alkylsilyl, nitro, carboxyl, hydroxyl, mercapto, amino, cyano, phenyl, naphthyl, phenoxy, and phenylthio groups; $Ar^8$ to $Ar^{10}$, and $Ar^{12}$ are each a monovalent group, and $Ar^{11}$ is a divalent group; ($X^7$)⁻ and ($X^8$)⁻ are each a negative ion; and c is an integer of 0 to 2, d is an integer of 1 to 3, and (c+d) is 2 or 3 and is the same as the valence of $A^2$.

Examples of halogens, and C1-C20 acyl, C1-C20 alkyl, C1-C20 alkoxy, C1-C20 alkylthio, and C1-C20 alkylsilyl groups include those listed above for the formulas (1) and (2).

In terms of the efficiency of acid generation, $A^2$ in the formula (16) is preferably a group represented by any one of the above formulas (7) to (10), and more preferably a group represented by any one of the formulas (5) and (8) to (10).

$Ar^8$ to $Ar^{12}$ in the formulas (15) and (16) are groups that absorb light of wavelengths within the ultraviolet to visible range.

$Ar^8$ to $Ar^{12}$ preferably contain 1 to 5 benzene rings and more preferably 1 to 4 benzene rings. Specific examples and preferred examples of $Ar^8$ to $Ar^{12}$ are those listed for $Ar^1$ to $Ar^7$ in the formulas (1) and (2).

Examples and preferred examples of ($X^7$)⁻ and ($X^8$)⁻ are those listed above for ($X^1$)⁻ and ($X^2$)⁻ in the formulas (1) and (2).

Examples of the iodonium salt derivatives (B122) include compounds having a cationic structure such as a (4-methylphenyl){4-(2-methylpropyl)phenyl}iodonium cation structure, a [bis(4-t-butylphenyl)]iodonium cation structure, a [bis(4-t-butylphenyl)]trifluoro[tris(perfluoroethyl)]iodonium cation structure, a [bis(4-methoxyphenyl)]iodonium cation structure, and a [bis(4-methoxyphenyl)]iodonium cation structure; and compounds represented by the following formulas (17) to (20). These are preferred in terms of the efficiency of acid generation. Compounds represented by the following formulas (17) to (20) are more preferred.

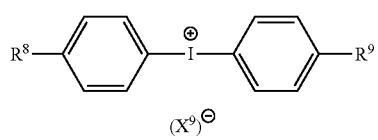

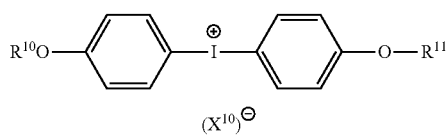

-continued

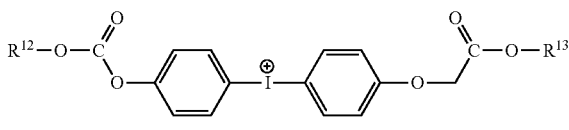

(19)

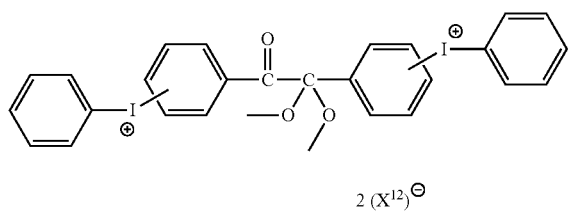

(20)

In the formulas (17) to (20), $R^8$ to $R^{13}$ are each an atom or substituent selected from the group consisting of hydrogen, halogens, and C1-C20 acyl, C1-C20 alkyl, C1-C20 alkoxy, C1-C20 alkylthio, C1-C20 alkylsilyl, nitro, carboxyl, hydroxyl, mercapto, amino, cyano, phenyl, and naphthyl groups; and $(X^9)^-$ to $(X^{12})^-$ are each a negative ion.

Examples of halogens, and C1-C20 acyl, C1-C20 alkyl, C1-C20 alkoxy, C1-C20 alkylthio, and C1-C20 alkylsilyl groups include those listed above for the formulas (1) and (2).

Preferred examples of $R^8$ to $R^{13}$ include halogens, and cyano, phenyl, naphthyl, C1-C20 alkyl, and C1-C20 alkoxy groups. Cyano, phenyl, C1-C15 alkyl, C1-C15 alkoxy, and C1-C15 acyl groups are more preferred, and C1-C10 alkyl, C1-C10 alkoxy, and C1-C10 acyl groups are particularly preferred. The alkyl chains of these groups may be straight, branched, or cyclic.

Examples and preferred examples of $(X^9)^-$ to $(X^{12})^-$ in the formulas (17) to (20) are those listed above for $(X^1)^-$ and $(X^2)^-$ in the formulas (1) and (2).

Common photopolymerization initiators suited for curing by light of wavelengths within the visible range (360 nm to 830 nm; see JIS-Z 8120) are themselves colored so as to be able to absorb visible light, and the color thereof gives a bad influence on the hue of cured coatings. However, the use of a compound represented by the formula (2) or (16) eliminates such a bad influence on the hue of cured coatings.

Examples of the sulfonic acid ester derivatives (B31) include cyclohexyl methanesulfonate, isopropyl ethanesulfonate, t-butyl benzene sulfonate, cyclohexyl p-toluenesulfonate, and cyclohexyl naphthalene sulfonate.

Examples of the acetic acid ester derivatives (B32) include cyclohexyl dichloroacetate and isopropyl trichloroacetate.

Examples of the phosphonic acid esters (B33) include triphenylphosphonic acid cyclohexyl ester.

In terms of the photocurability, the amount of the acid generator (B) is preferably 0.05 to 30% by weight, and more preferably 0.1 to 20% by weight of the polymerizable substance (D).

In the present invention, the base generator (C) refers to a compound that generates a base on exposure to active rays, radicals, or a base, and examples thereof include known compounds such as base generators (C1) that generate a base on exposure to active rays, base generators (C2) that generate a base on exposure to radicals, and base generators (C3) that generate a base on exposure to a base.

For example, oxime derivatives (C121), quaternary ammonium salt derivatives (C122), and quaternary amidine salt derivatives (C123) all generate a base on exposure to either active rays or radicals, and therefore any of these can be used as both of (C1) and (C2).

Carbamate derivatives (C31) generate a base on exposure to a base, and therefore can used as (C3).

(C) may be a single compound or may be a combination of two or more compounds.

Examples of the oxime derivatives (C121) include o-acyloxime.

Examples of the carbamate derivatives (C31) include 1-Fmoc-4-piperidone and o-nitrobenzoyl carbamate.

Examples of the quaternary ammonium salt derivatives (C122) and the quaternary amidine salt derivatives (C123) include compounds represented by the following formulas (21) to (23).

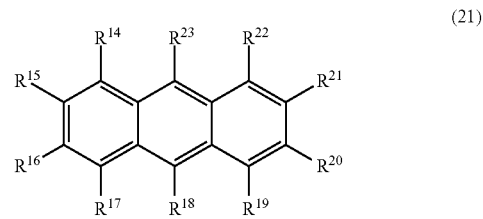

(21)

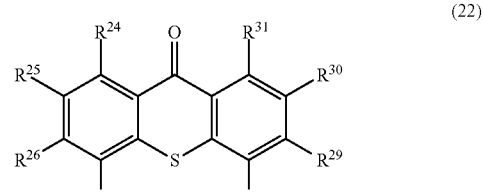

(22)

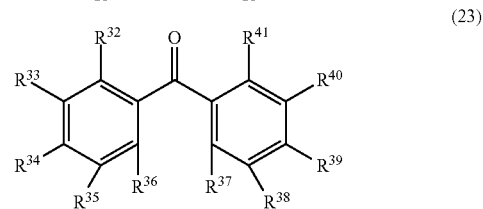

(23)

$R^{14}$ to $R^{41}$ in the formulas (21) to (23) are individually an atom or substituent selected from the group consisting of hydrogen, halogens, C1-C20 acyl, C1-C20 alkyl, C1-C20 alkoxy, C1-C20 alkylthio, C1-C20 alkylsilyl, nitro, carboxyl, hydroxyl, mercapto, amino, cyano, phenyl, and naphthyl groups, substituents represented by the following formula (24), and substituents represented by the following formula (25). At least one of $R^{14}$ to $R^{23}$ is a substituent represented by the formula (24) or (25). At least one of $R^{24}$ to $R^{31}$ is a substituent represented by the formula (24) or (25). At least one of $R^{32}$ to $R^{41}$ is a substituent represented by the formula (24) or (25).

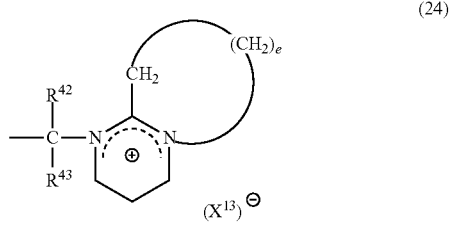

(24)

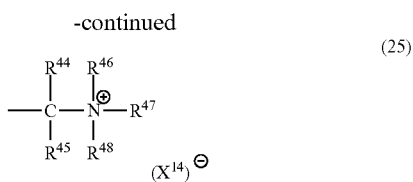

(25)

In the formulas (24) and (25), $R^{42}$ to $R^{45}$ are each a hydrogen or C1-C20 alkyl group; $R^{46}$ to $R^{48}$ are each a C1-C20 alkyl group optionally substituted by a hydroxyl group; $(X^{13})^-$ and $(X^{14})^-$ are each a negative ion; and e is an integer of 2 to 4.

Examples of halogens, and C1-C20 acyl, C1-C20 alkyl, C1-C20 alkoxy, C1-C20 alkylthio and C1-C20 alkylsilyl groups in the formulas (21) to (23) include those listed above for the formulas (1) and (2).

Compounds represented by the formula (21), compounds represented by the formula (22), and compounds represented by the formula (23) have an anthracene structure, a thioxanthone structure, and a benzophenone structure, respectively. These compounds are examples of those having a maximum absorption wavelength of around the i-line (365 nm). $R^{14}$ to $R^{23}$ are introduced for adjustment of the absorption wavelength range or sensitivity, or for modification based on a consideration of properties such as thermal stability, reactivity, and decomposability, and are each an atom or substituent selected from the group consisting of hydrogen, halogens, C1-C20 alkoxy, nitro, carboxyl, hydroxyl, mercapto, C1-C20 alkylsilyl, C1-C20 acyl, amino, cyano, C1-C20 alkyl, phenyl, and naphthyl groups, in accordance with the purpose. Here, at least one of $R^{14}$ to $R^{23}$ should be a substituent represented by the formula (24) or (25).

Preferred examples of $R^{14}$ to $R^{23}$ include halogens, and cyano, phenyl, naphthyl, C1-C20 alkyl, and C1-C20 alkoxy groups. Cyano, phenyl, C1-C15 alkyl, C1-C15 alkoxy, and C1-C15 acyl groups are more preferred, and C1-C10 alkyl, C1-C10 alkoxy, and C1-C10 acyl groups are particularly preferred. The alkyl chains of these groups may be straight, branched, or cyclic.

Specific examples of $R^{14}$ to $R^{23}$ include the compounds listed for $R^8$ to $R^{13}$ in the formulas (17) to (19).

Substituents represented by the formula (24) are substituents having a cationic amidine structure, and e is an integer of 2 to 4. Preferred examples of these substituents include a substituent having the cationic form of 1,8-diazabicyclo[5.4.0]-7-undecene (e=4), and a substituent having the cationic form of 1,5-diazabicyclo[4.3.0]-5-nonene (e=2). $R^{42}$ and $R^{43}$ are each a hydrogen or C1-C20 alkyl group, and preferred examples thereof include hydrogen and C1-C10 alkyl groups. Hydrogen and C1-C5 alkyl groups are more preferred.

Substituents represented by the formula (25) have a quaternary ammonium structure. $R^{44}$ and $R^{45}$ are each a hydrogen or C1-C20 alkyl group, and preferred examples thereof include hydrogen and C1-C10 alkyl groups. Hydrogen and C1-C5 alkyl groups are more preferred. $R^{46}$ to $R^{48}$ are each a linear, branched, or cyclic C1-C20 alkyl group optionally substituted by hydroxyl group(s). Preferred examples of $R^{46}$ to $R^{48}$ include C1-C10 alkyl groups. C1-C5 alkyl groups are particularly preferred.

$(X^{13})^-$ and $(X^{14})^-$ in the formulas (24) and (25) are each a negative ion, and specific examples thereof include those listed above for $(X^1)^-$ and $(X^2)^-$ in the formulas (1) and (2). In terms of the photodegradability, aliphatic or aromatic carboxyl ions and borate anions are preferred among the examples listed above.

In compounds represented by the formula (24), the bond between the nitrogen and the carbon to which $R^{42}$ and $R^{43}$ are linked is broken by exposure to active rays, which results in formation of a basic compound having an amidine structure. In compound represented by the formula (25), the bond between the nitrogen and the carbon to which $R^{44}$ and $R^{45}$ are linked is broken by exposure to active rays, which results in formation of a tertiary amine.

In terms of the photodegradability, compounds represented by the following formula (26) are preferred among these photobase generators (C1).

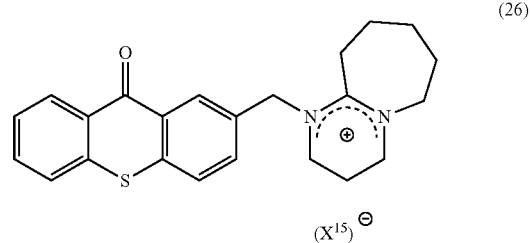

(26)

$(X^{15})^-$ in the formula (26) is a negative ion, and specific examples thereof include those listed above for $(X^1)^-$ and $(X^2)^-$ in the formulas (1) and (2). In terms of the photodegradability, aliphatic or aromatic carboxyl ions and borate anions are preferred among these.

Examples of the carbamate derivatives (C31) include 1-Z-4-piperidone.

In terms of the photocurability, the amount of the base generator (C) is preferably 0.05 to 30% by weight, and more preferably 0.1 to 20% by weight of the polymerizable substance (D).

In the present invention, the following combination of (A1) to (A3), (B1) to (B3), and (C1) to (C3) are preferred:
(1) (A1) and (B2);
(2) (A1), (B2), and (B3);
(3) (B1) and (A2);
(4) (B1), (A2), and (B3);
(5) (C1) and (A3);
(6) (C1), (A3), and (C3);
(7) (A1) and (C2);
(8) (A1), (C2), and (C3);
(9) a combination of two or more of the combinations (1) to (4); and
(10) a combination of two or more of the combinations (5) to (8).

In the case of the combination (1), the active species (H) that is generated on exposure to active rays is radicals, and the active species (I) is an acid. The active species (H) diffuses to parts which attenuated active rays reach or which active rays do not reach, and accelerates curing of these parts.

In the case of the combination (2), the active species (I) is an acid as in the case of the combination (1). This acid reacts with (B3). As a result of the reaction, another acid is accumulated and accelerates curing of parts which attenuated active rays reach or which active rays do not reach.

In the case of the combination (3), the active species (H) that is generated on exposure to active rays is an acid, and the active species (I) is radicals. The active species (H) diffuses to parts which attenuated active rays reach or which active rays do not reach, and accelerates curing of these parts.

In the case of the combination (4), the active species (H) is an acid as in the case of the combination (3). This acid reacts with (B3). As a result of the reaction, another acid is accumulated and accelerates curing of parts which attenuated active rays reach or which active rays do not reach.

In the case of the combination (5), the active species (H) that is generated on exposure to active rays is a base, and the active species (I) is radicals. The active species (H) diffuses to parts which attenuated active rays reach or which active rays do not reach, and accelerates curing of these parts.

In the case of the combination (6), the active species (H) is a base as in the case of the combination (5). This base reacts with (C3). As a result of the reaction, another base is accumulated and accelerates curing of parts which attenuated active rays reach or which active rays do not reach.

In the case of the combination (7), the active species (H) that is generated on exposure to active rays is radicals, and the active species (I) is a base. The active species (H) diffuses to parts which attenuated active rays reach or which active rays do not reach, and accelerates curing of these parts.

In the case of the combination (8), the active species (I) is a base as in the case of the combination (7). This base reacts with (C3). As a result of the reaction, another base is accumulated and accelerates curing of parts which attenuated active rays reach or which active rays do not reach.

Examples of the polymerizable substance (D) in the present invention include known compounds such as radical polymerizable compounds (D1) and ionic polymerizable compounds (D2). (D) may be a single compound or may be a combination of two or more compounds. Optionally, polymerization inhibitor(s) such as hydroquinone and methyl ether hydroquinone may be used together.

Examples of the radical polymerizable compounds (D1) include C3-C35 acrylamide compounds (D11), C4-C35 (meth)acrylate compounds (D12), C6-C35 aromatic vinyl compounds (D13), C3-C20 vinyl ether compounds (D14), and other radical polymerizable compounds (D15).

As used herein, the term "(meth)acrylate" is used to refer to one or both of "acrylate" and "methacrylate", and the term "(meth)acryl" is used to refer to one or both of "acryl" and "methacryl".

Examples of the C3-C35 (meth)acrylamide compounds (D11) include (meth)acrylamide, N-methyl(meth)acrylamide, N-ethyl(meth)acrylamide, N-propyl(meth)acrylamide, N-n-butyl(meth)acrylamide, N-t-butyl(meth)acrylamide, N-butoxymethyl(meth)acrylamide, N-isopropyl(meth)acrylamide, N-methylol(meth)acrylamide, N,N-dimethyl(meth)acrylamide, N,N-diethyl(meth)acrylamide, and (meth)acryloylmorpholine.

Examples of the C4-C35 (meth)acrylate compounds (D12) include mono to hexafunctional (meth)acrylates.

Examples of monofunctional (meth)acrylates include ethyl (meth)acrylate, hexyl (meth)acrylate, 2-ethylhexyl (meth)acrylate, tert-octyl (meth)acrylate, isoamyl (meth)acrylate, decyl (meth)acrylate, isodecyl (meth)acrylate, stearyl (meth)acrylate, isostearyl (meth)acrylate, cyclohexyl (meth)acrylate, 4-n-butylcyclohexyl (meth)acrylate, bornyl (meth)acrylate, isobornyl (meth)acrylate, benzyl (meth)acrylate, 2-ethylhexyl diglycol (meth)acrylate, butoxyethyl (meth)acrylate, 2-chloroethyl (meth)acrylate, 4-bromobutyl (meth)acrylate, cyanoethyl (meth)acrylate, benzyl (meth)acrylate, butoxymethyl (meth)acrylate, methoxypropylene monoacrylate, 3-methoxybutyl (meth)acrylate, alkoxymethyl (meth)acrylates, 2-ethylhexyl calbitor (meth)acrylate, alkoxyethyl (meth)acrylates, 2-(2-methoxyethoxy)ethyl (meth)acrylate, 2-(2-butoxyethoxy)ethyl (meth)acrylate, 2,2,2-tetrafluoroethyl (meth)acrylate, 1H,1H,2H,2H-perfluorodecyl (meth)acrylate, 4-butylphenyl (meth)acrylate, phenyl (meth)acrylate, 2,4,5-tetramethylphenyl (meth)acrylate, 4-chlorophenyl (meth)acrylate, phenoxymethyl (meth)acrylate, phenoxyethyl (meth)acrylate, glycidyl (meth)acrylate, glycidyloxybutyl (meth)acrylate, glycidyloxyethyl (meth)acrylate, glycidyloxypropyl (meth)acrylate, diethyleneglycol monovinyl ether monoacrylate, tetrahydrofurfuryl (meth)acrylate, hydroxyalkyl (meth)acrylates, 2-hydroxyethyl (meth)acrylate, 3-hydroxypropyl (meth)acrylate, 2-hydroxypropyl (meth)acrylate, 2-hydroxybutyl (meth)acrylate, 4-hydroxybutyl (meth)acrylate, dimethylaminoethyl (meth)acrylate, diethylaminoethyl (meth)acrylate, dimethylaminopropyl (meth)acrylate, diethylaminopropyl (meth)acrylate, trimethoxysilylpropyl (meth)acrylate, trimethoxysilylpropyl (meth)acrylate, trimethylsilylpropyl (meth)acrylate, polyethylene oxide monomethyl ether (meth)acrylate, oligoethylene oxide monomethyl ether (meth)acrylate, polyethylene oxide (meth)acrylate, oligoethylene oxide (meth)acrylate, oligoethylene oxide monoalkyl ether (meth)acrylates, polyethylene oxide monoalkyl ether (meth)acrylates, dipropylene glycol (meth)acrylate, polypropylene oxide monoalkyl ether (meth)acrylates, oligopropylene oxide monoalkyl ether (meth)acrylates, 2-methacryloyloxyethylsuccinic acid, 2-methacryloyloxyhexahydrophthalic acid, 2-methacryloyloxyethyl-2-hydroxypropyl phthalate, butoxydiethylene glycol (meth)acrylate, trifluoroethyl (meth)acrylate, perfluorooctylethyl (meth)acrylate, 2-hydroxy-3-phenoxypropyl (meth)acrylate, EO-modified phenol (meth)acrylate, EO-modified cresol (meth)acrylate, EO-modified nonylphenol (meth)acrylate, PO-modified nonylphenol (meth)acrylate, and EO-modified 2-ethylhexyl (meth)acrylate.

Examples of bifunctional (meth)acrylates include 1,4-butane di(meth)acrylate, 1,6-hexane diacrylate, polypropylene diacrylate, 1,6-hexanediol di(meth)acrylate, 1,10-decanediol di(meth)acrylate, neopentyl diacrylate, neopentyl glycol di(meth)acrylate, 2,4-dimethyl-1,5-pentanediol di(meth)acrylate, butylethylpropanediol (meth)acrylate, ethoxylated cyclohexane methanol di(meth)acrylate, polyethylene glycol di(meth)acrylate, oligoethylene glycol di(meth)acrylate, ethylene glycol di(meth)acrylate, 2-ethyl-2-butyl-butanediol di(meth)acrylate, neopentyl glycol hydroxypivalate di(meth)acrylate, EO-modified bisphenol A di(meth)acrylate, bisphenol F polyethoxy di(meth)acrylate, polypropylene glycol di(meth)acrylate, oligopropylene glycol di(meth)acrylate, 1,4-butanediol di(meth)acrylate, 2-ethyl-2-butyl-propanediol di(meth)acrylate, 1,9-nonane di(meth)acrylate, propoxylated ethoxylated bisphenol A di(meth)acrylate, and tricyclodecane di(meth)acrylate.

Examples of trifunctional (meth)acrylates include trimethylolpropane tri(meth)acrylate, trimethylolethane tri(meth)acrylate, alkyleneoxide-modified trimethylolpropane tri(meth)acrylates, pentaerythritol tri(meth)acrylate, dipentaerythritol tri(meth)acrylate, trimethylolpropane tri((meth)acryloyloxypropyl)ether, isocyanuric acid alkylene oxide-modified tri(meth)acrylates, dipentaerythritol propionate tri(meth)acrylate, tri((meth)acryloyloxyethyl)isocyanurate, hydroxypivalaldehyde-modified dimethylolpropane tri(meth)acrylate, sorbitol tri(meth)acrylate, propoxylated trimethylolpropane tri(meth)acrylate, and ethoxylated glycerin triacrylate.

Examples of tetrafunctional (meth)acrylates include pentaerythritol tetra(meth)acrylate, sorbitol tetra(meth)acrylate, ditrimethylolpropane tetra(meth)acrylate, dipentaerythritol propionate tetra(meth)acrylate, and ethoxylated pentaerythritol tetra(meth)acrylate.

Examples of pentafunctional (meth)acrylates include sorbitol penta(meth)acrylate and dipentaerythritol penta(meth) acrylate.

Examples of hexafunctional (meth)acrylates include dipentaerythritol hexa(meth)acrylate, sorbitol hexa(meth) acrylate, alkylene oxide-modified phosphazene hexa(meth) acrylates, and caprolactone-modified dipentaerythritol hexa (meth)acrylate.

Examples of C6-C35 aromatic vinyl compounds (D13) include vinyl thiophene, vinyl furan, vinyl pyridine, styrene, methyl styrene, trimethylstyrene, ethylstyrene, isopropylstyrene, chloromethylstyrene, methoxystyrene, acetoxystyrene, chlorostyrene, dichlorostyrene, bromostyrene, methyl vinyl benzoate, 3-methylstyrene, 4-methylstyrene, 3-ethylstyrene, 4-ethylstyrene, 3-propylstyrene, 4-propylstyrene, 3-butylstyrene, 4-butylstyrene, 3-hexylstyrene, 4-hexylstyrene, 3-octylstyrene, 4-octylstyrene, 3-(2-ethylhexyl)styrene, 4-(2-ethylhexyl)styrene, allylstyrene, isopropenylstyrene, butenylstyrene, octenylstyrene, 4-t-butoxycarbonylstyrene, 4-methoxystyrene, and 4-t-butoxystyrene.

Examples of the C3-C35 vinyl ether compounds (D14) include following monofunctional or multifunctional vinyl ethers.

Examples of monofunctional vinyl ethers include methyl vinyl ether, ethyl vinyl ether, propyl vinyl ether, n-butyl vinyl ether, t-butyl vinyl ether, 2-ethyl hexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxy ethyl vinyl ether, ethoxyethoxy ethyl vinyl ether, methoxy polyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxypolyethylene glycol vinyl ether.

Examples of multifunctional vinyl ethers include divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ethers, and bisphenol F alkylene oxide divinyl ethers; and trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, an ethylene oxide adduct of trimethylolpropane trivinyl ether, a propylene oxide adduct of trimethylolpropane trivinyl ether, an ethylene oxide adduct of ditrimethylolpropane tetravinyl ether, a propylene oxide adduct of ditrimethylolpropane tetravinyl ether, an ethylene oxide adduct of pentaerythritol tetravinyl ether, a propylene oxide adduct of pentaerythritol tetravinyl ether, an ethylene oxide adduct of dipentaerythritol hexavinyl ether, and a propylene oxide adduct of dipenta erythritol hexavinyl ether.

Examples of the other radical polymerizable substances (D15) include acrylonitrile, vinyl ester compounds (e.g. vinyl acetate, vinyl propionate, vinyl versatate), allyl ester compounds (e.g. allyl acetate), halogen-containing monomers (e.g. vinylidene chloride, vinyl chloride), and olefin compounds (e.g. ethylene, propylene).

In terms of the cure rate, the C3-C35 acryl amide compounds (D11), the C4-C35 (meth)acrylate compounds (D12), the C6-C35 aromatic vinyl compounds (D13), and the C3-C20 vinyl ether compounds (D14) are preferred among these. The C3-C35 acryl amide compounds (D11) and the C4-C35 (meth)acrylate compounds (D12) are more preferred.

Examples of the ionic polymerizable compounds (D2) include C3-C20 epoxy compounds (D21) and C4-C20 oxetane compounds (D22).

Examples of the C3-C20 epoxy compounds (D21) include the following monofunctional or multifunctional epoxy compounds.

Examples of monofunctional epoxy compounds include phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monooxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinyl cyclohexene oxide.

Examples of multifunctional epoxy compounds include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl)adipate, vinyl cyclohexene oxide, 4-vinyl epoxycyclohexane, bis(3,4-epoxy-6-methylcyclohexylmethyl)adipate, 3,4-epoxy-6-methylcyclohexyl-3',4'-epoxy-6'-methylcyclohexa ne carboxylate, methylene bis(3, 4-epoxycyclohexane), dicyclopentadiene diepoxide, ethylene glycol di(3,4-epoxycyclohexylmethyl)ether, ethylene bis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers 1,1,3-tetradecadiene dioxide, limonene dioxide, 1,2,7,8-diepoxyoctane, and 1,2,5, 6-diepoxy cyclooctane.

In terms of the cure rate, aromatic or alicyclic epoxides are preferred among these epoxide compounds. Particularly preferred are alicyclic epoxides.

Examples of the C4-C20 oxetane compounds (D22) include compounds containing one to six oxetane rings.

Examples of compounds containing one oxetane ring include 3-ethyl-3-hydroxymethyloxetane, 3-(meth)allyloxymethyl-3-ethyloxetane, (3-ethyl-3-oxetanylmethoxy) methylbenzene, 4-fluoro-[1-(3-ethyl-3-oxetanylmethoxy) methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3-ethyl-3-oxetanylmethyl) ether, 2-ethylhexyl(3-ethyl-3-oxetanylmethyl)ether, ethyldiethylene glycol(3-ethyl-3-oxetanylmethyl)ether, dicyclopentadiene(3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuryl (3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3- oxetanylmethyl)ether, 2-hydroxypropyl(3-ethyl-3-oxetanylmethyl)ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, and bornyl (3-ethyl-3-oxetanylmethyl)ether.

Examples of compounds containing two to six oxetane rings include 3,7-bis(3-oxetanyl)-5-oxa-nonan, 3,3'-(1,3-(2-methylenyl)propanediyl bis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis (3-ethyl-3-oxetanylmethyl)ether, tricyclodecanediyl dimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis (3-ethyl-3-oxetanylmethyl)ether, ditrimethyiolpropane tetrakis(3-ethyl-3-oxetanylmethyl)ether, EO-modified bisphenol A bis(3-ethyl-3-oxetanylmethyl) ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, and EO-modified bisphenol F (3-ethyl-3-oxetanylmethyl)ether.

In terms of the cure rate, compounds containing one or two oxetane rings are preferred among these.

Examples of the colorant (E) in the present invention include pigments (e.g. inorganic pigments, organic pigments) and dyes conventionally used in paints and inks.

Examples of inorganic pigments include chrome yellow, zinc yellow, iron blue, barium sulfate, cadmium red, titanium oxide, zinc white, red ocher, alumina, calcium carbonate, ultramarine, carbon black, graphite, and titanium black.

Examples of organic pigments include soluble azo pigments such as β-naphthol-based, β-oxynaphthoic anilide-based, acetoacetic anilide-based, and pyrazolone-based pigments; insoluble azo pigments such as β-naphthol-based, β-oxynaphthoic acid-based, β-oxynaphthoic anilide-based, acetoacetic anilide-based monoazo, acetoacetic anilide-based disazo, and pyrazolone-based pigments; phthalocyanine pigments such as copper phthalocyanine blue, halogenated copper phthalocyanine blue, sulfonated copper phthalocyanine blue, and metal-free phthalocyanine; and polycyclic or heterocyclic pigments such as isoindolinone-based, quinacridone-based, dioxazine-based, perynone-based, and perylene-based pigments.

Specific examples of dyes are listed below. Examples of yellow dyes include aryl or heteryl azo dyes which contain as a coupling component any of phenols, naphthols, anilines, pyrazolones, pyridone, and open-ring active methylene compounds; azomethine dyes which contain an opened active methylene compound as a coupling component; methine dyes such as benzylidene dyes and monomethineoxonol dyes; quinone dyes such as naphthoquinone dyes and anthraquinone dyes; quinophthalone dyes; nitro/nitroso dyes; acridine dyes; and acridinone dyes.

Examples of magenta dyes include aryl or heteryl azo dyes which contain as a coupling component any of phenols, naphthols, anilines, pyrazolones, pyridones, pyrazolotriazoles, closed-ring active methylene compounds, and hetero rings (e.g. pyrrole, imidazole, thiophene, thiazole derivatives); azomethine dyes which contain as a coupling component any of pyrazolones and pyrazolotriazoles; methine dyes such as arylidene dyes, styryl dyes, merocyanine dyes and oxonol dyes; carbonium dyes such as diphenylmethane dyes, triphenylmethane dyes, and xanthene dyes; quinone dyes such as naphthoquinone, anthraquinone, and anthrapyridone; and fused polycyclic dyes such as dioxadine dyes.

Examples of cyan dyes include azomethine dyes such as indoaniline dyes and indophenol dyes; polymethine dyes such as cyanine dyes, oxonol dyes, and merocyanine dyes; carbonium dyes such as diphenylmethane dyes, triphenylmethane dyes, and xanthene dyes; phthalocyanine dyes; anthraquinone dyes; aryl or heteryl azo dyes which contain as a coupling component any of phenols, naphthols, anilines, pyrrolopyrimidinone, and pyrrolotriazinone derivatives (e.g. C.I. Direct blue-14); and indigo and thioindigo dyes.

In order to provide clear coatings, the particle size of the colorant (E) is preferably 0.01 μm to 2.0 μm, and more preferably 0.01 μm to 1.0 μm, on the average.

The amount of the colorant (E) is not particularly limited, but is preferably 1 to 60% by weight of the photosensitive composition.

If a pigment is used, the photosensitive composition of the present invention preferably contains pigment dispersant(s) in order to enhance the dispersability of the pigment and the storage stability of the photosensitive composition.

Examples of pigment dispersants include pigment dispersants produced by BYK Japan K.K. (e.g. Anti-Terra-U, Disperbyk-101, 103, 106, 110, 161, 162, 164, 166, 167, 168, 170, 174, 182, 184, 2020), pigment dispersants produced by Ajinomoto Fine-Techno Co., Inc. (e.g. AJISPER PB711, PB821, PB814, PN411, PA111), and pigment dispersants produced by The Lubrizol Corporation (e.g. Solsperse 5000, 12000, 32000, 33000, 39000). Any of these pigment dispersants may be used alone, or two or more of these may be used in combination. The amount of pigment dispersant(s) is not particularly limited, but is preferably 0.1 to 10% by weight of the photosensitive composition.

In the case where the photosensitive composition of the present invention contains the metal oxide powder (F) or the metal powder (G), the photosensitive composition can be used to form green sheets and electrode layers for ceramic electronic devices.

The metal oxide powder (F) is used for formation of dielectric layers. Examples of (F) include titanium oxide, aluminum oxide, barium titanate, calcium zirconate, niobium oxide, and lead zirconate titanate. Preferred is barium titanate.

In terms of the dielectric constant, the particle size of (F) is preferably 0.01 μm to 2.0 μm, and more preferably 0.01 μm to 1.0 μm, on the average.

The metal powder (G) is used to form a conductor layer and is specifically made of a noble or base metal. Specific examples thereof include palladium, nickel, copper, silver, and gold. Preferred are palladium, nickel, and copper.

The average particle size of (G) is preferably 0.01 μm to 10 μm.

The photosensitive composition of the present invention may optionally contain solvent(s), sensitizer(s), tackifier(s) (e.g. silane coupling agent), and the like.

Examples of solvents include glycol ethers (e.g. ethylene glycol monoalkyl ethers, propylene glycol monoalkyl ethers), ketones (e.g. acetone, methyl ethyl ketone, methyl isobutyl ketone, cyclo hexanon), esters (e.g. ethyl acetate, butyl acetate, ethylene glycol alkyl ether acetates, propylene glycol alkyl ether acetates), aromatic hydrocarbons (e.g. toluene, xylene, mesitylene, limonene), alcohols (e.g. methanol, ethanol, normal propanol, isopropanol, butanol, geraniol, linalool, rhodinol), and ethers (e.g. tetrahydrofuran, 1,8-cineole). Any of these may be used alone, or two or more of these may be used in combination.

The solvent content of the photosensitive composition is preferably 0 to 99% by weight, more preferably 3 to 95% by weight, and particularly preferably 5 to 90% by weight.

Examples of sensitizers include ketocumarin, fluorene, thioxanthone, anthraquinone, naphthiazoline, biacetyl, benzyl, derivatives of these, perylene, and substituted anthracene. The amount of sensitizer(s) is preferably 0 to 20% by weight, more preferably 1 to 15% by weight, and particularly preferably 5 to 10% by weight of the photosensitive composition.

Examples of tackifiers include γ-aminopropyltrimethoxysilane, γ-aminopropyltriethoxysilane, vinyltriethoxysilane, γ-glycidoxypropyltriethoxysilane, γ-methacryloxypropyltrimethoxysilane, urea propyltriethoxysilane, tris(acetyl acetonato)aluminum, and acetyl acetate aluminum diisopropylate. The amount of tackifier(s) is preferably 0 to 20% by weight, more preferably 1 to 15% by weight, and particularly preferably 5 to 10% by weight of the photosensitive composition.

The photosensitive composition of the present invention may further contain inorganic fine particulates, dispersing agent(s), antifoamer(s), leveling agent(s), thixotropy imparting agent(s), slip additive(s), flame retardant(s), antistatic agent(s), antioxidant(s), ultraviolet absorber(s), and the like, in accordance with the purpose of its usage.

The photosensitive composition of the present invention can be prepared by kneading the radical initiator (A); the polymerizable substance (D); the acid generator (B) or the base generator (C); and the colorant (E), the metal oxide powder (F), or the metal powder (G); and optionally solvent(s) and other materials together using a ball mill or three roll mills. The kneading temperature is commonly 10° C. to 40° C., and is preferably 20° C. to 30° C.

Since the photosensitive composition of the present invention can be photocured by exposure to active rays of 360 nm to 830 nm, the following lamps in addition to common high-pressure mercury lamps are usable: ultra-high-pressure mercury lamps, metal halide lamps, high-power metal halide lamps (Latest trend of UV-EB curing technique, edited by RadTech Japan, CMC Publishing Co., Ltd., page 138, 2006), and the like. Irradiators equipped with an LED light source are also suitably used. Heating treatment may be carried out during and/or after active ray radiation so as to diffuse a base generated from the photobase generator. In this case, the heating temperature is commonly 30° C. to 200° C., and is preferably 35° C. to 150° C., and more preferably 40° C. to 120° C.

The photosensitive composition of the present invention can be applied to a base material by known coating methods such as spin coating, roll coating, and spray coating, or known printing methods such as lithography, carton printing, metal printing, offset printing, silk screening, and gravure printing. The composition may be applied by inkjet methods in which tiny droplets are continuously discharged.

EXAMPLES

The following examples illustrate the present invention in more detail. They are, however, by no means limitative of the scope of the invention. All percentages and parts used below are by weight unless otherwise specified.

[Production of Acid Generator (B)]

Preparation 1

[Synthesis of Acid Generator (B121-1) {Compound Represented by Formula (27)}]

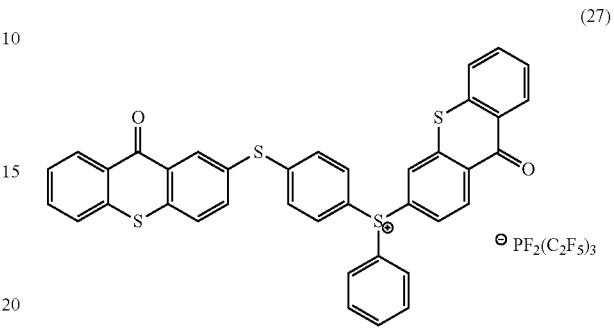

(27)

(1) Synthesis of 2-(phen thio)thioxanthone [Intermediate (B121-1-1)]

2-Chlorothioxanthone (11.0 parts), thiophenol (4.9 parts), potassium hydroxide (2.5 parts), and N,N-dimethyl formamide (162 parts) were homogeneously mixed and allowed to react at 130° C. for nine hours. Subsequently, the resulting reaction mixture was cooled to room temperature (about 25° C.) and added to distilled water (200 parts) to give precipitates of the reaction product. The resulting mixture was then filtered, and the residue was washed with water until the pH of the filtrate became neutral. The residue was then dried under reduced pressure. As a result, a yellow powdery product was obtained. After purification by column chromatography (eluent: toluene/hexane=1/1 (volume ratio)), 3.1 parts of an intermediate (B121-1-1) was obtained (as yellow solids).

(2) Synthesis of 2-[(phenyl)sulfinyl]thioxanthone [Intermediate (B121-1-2)]

30% hydrogen peroxide aqueous solution (4.0 parts) was gradually added dropwise to a mixture of the intermediate (B121-1-1) (11.2 parts), acetonitrile (215 parts), and sulfuric acid (0.02 parts) with stirring at 40° C. The mixture was allowed to react at 40° C. to 45° C. for 14 hours, cooled to room temperature (about 25° C.), and added to distilled water (200 parts) to give precipitates of the reaction product. The resulting mixture was then filtered, and the residue was washed with water until the pH of the filtrate became neutral. The residue was then dried under reduced pressure, and a yellow powdery product was obtained. The product was subjected to purification by column chromatography (eluent: ethyl acetate/toluene=1/3 (volume ratio)) to give 13.2 parts of an intermediate (B121-1-2) (as yellow solids).

(3) Synthesis of Acid Generator (B121-1)

Trifluoro methanesulfonic acid (2.4 parts) was gradually added dropwise to a mixture of the intermediate (B121-1-2) (4.3 parts), acetic anhydride (4.1 parts), and acetonitrile (110 parts) with stirring at 40° C. The mixture was allowed to react at 40° C. to 45° C. for one hour. The reaction mixture was cooled to room temperature (about 25° C.), and added to distilled water (150 parts). The resulting mixture was extracted with chloroform and washed with water until the pH of the aqueous phase became neutral. The chloroform phase was transferred into a rotary evaporator, and the solvent was removed. Subsequently, the resulting product was dispersed in toluene (50 parts) by an ultrasonic cleaner. The dispersant was allowed to stand for about 15 minutes, and then the supernatant was removed. After repeating these procedures three times, the recovered solids were washed, and the residue was dried under reduced pressure. The residue was then dissolved in dichloromethane (212 parts), and the solution was added to 10% potassium tris(pentafluoroethyl)trifluorophosphate aqueous solution (65 parts). The resulting mixture was stirred at room temperature (about 25° C.) for two hours. The dichloromethane phase was separated by washing with water three times, and the organic solvent was evaporated under reduced pressure. As a result, 5.5 parts of an acid generator (B121-1) was obtained (as yellow solids).

Preparation 2
[Synthesis of Acid Generator (B121-2) {Compound Represented by Formula (28)}]

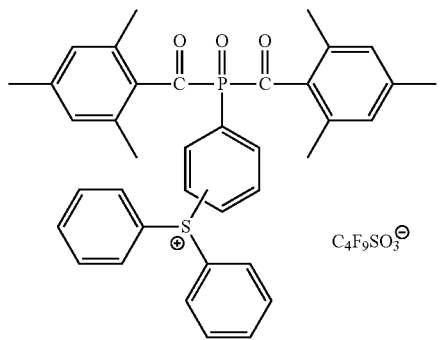

(28)

IRGACUR 819 [product of Ciba Japan K.K.] (4.2 parts), p-tolyl sulfoxide [product of Tokyo Chemical Industry Co., Ltd.] (2.8 parts), potassium nonafluoro-1-butane sulfonate [product of Tokyo Chemical industry Co., Ltd.] (4.1 parts), sulfuric acid [product of Wako Pure Chemical Industries, Ltd.] (1.2 parts), and acetonitrile (100 parts) were dissolved in a reaction vessel, and the solution was stirred at 60° C. for six hours. Dichloromethane (200 parts) was added, and the organic phase was washed with ion exchange water (200 parts) three times, and then subjected to vacuum distillation to remove the solvent. As a result, 6.7 parts of an acid generator (B121-2) was obtained (as yellow solids).

Preparation 3
[Synthesis of Acid Generator (B121-3) {Compound Represented by Formula (29)}]

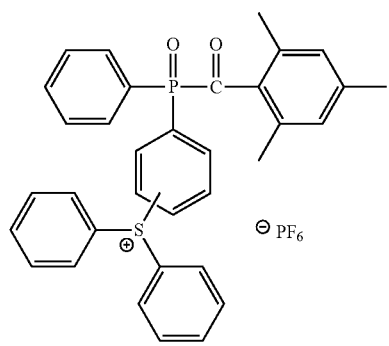

(29)

DAROCUR TPO [product of Ciba Japan K.K.] (3.5 parts), diphenyl sulfoxide [product of Tokyo Chemical Industry Co., Ltd.] (2.4 parts), potassium hexafluoro phosphate [product of Tokyo Chemical Industry Co., Ltd.] (2.2 parts), sulfuric acid [product of Wako Pure Chemical Industries, Ltd.] (1.2 parts), and acetonitrile (100 parts) were dissolved in a reaction vessel, and the solution was stirred at 60° C. for six hours. Dichloromethane (200 parts) was added, and the organic phase was washed with ion exchange water (200 parts) three times, and then subjected to vacuum distillation to remove the solvent. As a result, 5.4 parts of an acid generator (B121-3) was obtained (as yellow solids).

Preparation 4
[Synthesis of Acid Generator (B121-4) {Compound Represented by Formula (30)}]

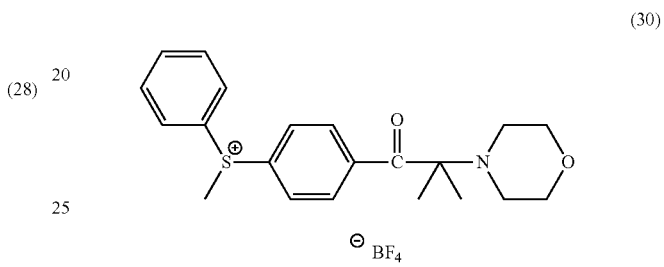

(30)

IRGACUR 907 [product of Ciba Japan K.K.] (2.8 parts), bromo benzene [product of Tokyo Chemical Industry Co., Ltd.] (1.7 parts), silver tetrafluoroborate [product of Tokyo Chemical Industry Co., Ltd.] (2.3 parts), and tetrahydrofuran (100 parts) were dissolved in a reaction vessel, and the solution was stirred at 60° C. for six hours. Dichloromethane (200 parts) was added, and the organic phase was washed with ion exchange water (200 parts) three times, and then subjected to vacuum distillation to remove the solvent. As a result, 3.3 parts of an acid generator (B121-4) was obtained (as pale yellow solids).

Preparation 5
[Synthesis of Acid Generator (B122-1) {Compound Represented by Formula (31)}]

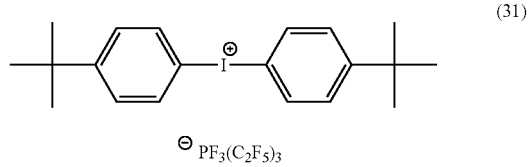

(31)

t-Butyl benzene [product of Tokyo Chemical Industry Co., Ltd.] (8.1 parts), potassium iodide [product of Tokyo Chemical Industry Co., Ltd.] (5.35 parts), and acetic anhydrides (20 parts) were dissolved in acetic acid (70 parts), and the solution was cooled to 10° C. The mixed solution of strong sulfuric acid (12 parts) and acetic acid (15 parts) was added dropwise over one hour, while the temperature was controlled to 10° C.±2° C. After the temperature was elevated to 25° C., the solution was stirred for 24 hours. Subsequently, diethyl ether (50 parts) was added to the obtained reaction mixture. The resulting mixture was washed with water three times, and diethyl ether was evaporated under reduced pressure. The residue was added to an aqueous solution of potassium{trifluoro[tris(perfluoroethyl)]phosphate} (118 parts dissolved in 100 parts of water). After stirring at 25° C.

for 20 hours, the reaction mixture was mixed with ethyl acetate (500 parts) and washed with water three times. The organic solvents were evaporated under reduced pressure to afford 14.0 parts of a target acid generator (B122-1) (as a pale yellow liquid).

Preparation 6
[Synthesis of Acid Generator (B122-2) {Compound Represented by Formula (32)}]

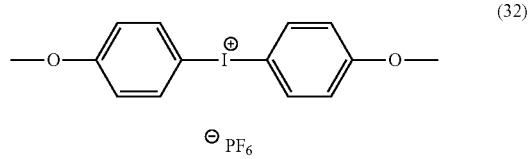

The same procedures were used as in Preparation 5, except that "t-butyl benzene (8.1 parts)" and "potassium{trifluoro[tris(perfluoroethyl)]phosphate} (118 parts)" were changed to "p-methoxy benzene [product of Tokyo Chemical Industry Co., Ltd.] (7.5 parts)" and "potassium hexafluoro phosphate [product of Tokyo Chemical Industry Co., Ltd.] (80 parts)", respectively. As a result, 12.1 parts of an acid generator (B122-2) was obtained (as a pale yellow liquid).

Preparation 7
[Synthesis of Acid Generator (B122-3) {Compound Represented by Formula (33)}]

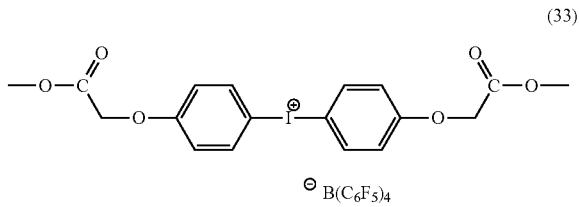

The same procedures were used as in Preparation 5, except that "t-butyl benzene (8.1 parts)" and "potassium {trifluoro[tris(perfluoroethyl)]phosphate} (118 parts)" were changed to "methyl phenoxy acetate [product of Tokyo Chemical Industry Co., Ltd.] (9.2 parts)" and "potassium tetrakis(perfluorophenyl)borate [product of Tokyo Chemical Industry Co., Ltd.] (140 parts)", respectively. As a result, 13.3 parts of an acid generator (B122-3) was obtained (as a pale yellow liquid).

Preparation 8
[Synthesis of Acid Generator (B122-4) {Compound Represented by Formula (34)}]

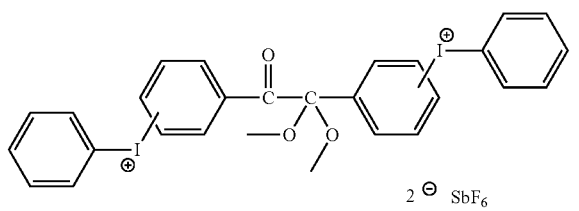

IRGACUR 651 [product of Ciba Japan K.K.] (2.4 parts), potassium iodide [product of Tokyo Chemical Industry Co., Ltd.] (4.0 parts), silver hexafluoroantimonate [product of Tokyo Chemical Industry Co., Ltd.] (8.2 parts), sulfuric acid [product of Wako Pure Chemical industries, Ltd.] (2.4 parts), benzene (5.0 parts), and acetonitrile (100 parts) were dissolved in a reaction vessel, and the solution was stirred at 60° C. for six hours. Dichloromethane (200 parts) was added thereto, the organic phase was washed with ion exchange water (200 parts) three times, and the solvent was removed by vacuum distillation. As a result, 10.7 parts of an acid generator (B122-4) was obtained (as pale yellow solids).

[Preparation of Base Generator (C)]
Preparation 9
[Synthesis of Base Generator (C122-1) {Compound Represented by Formula (35)}]

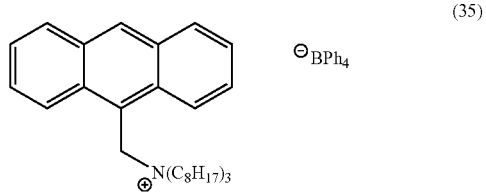

9-Chloromethyl anthracene (product of Aldrich) (2.0 parts) was dissolved in chloroform. To this solution were added small portions of trioctyl amine [product of Wako Pure Chemical Industries, Ltd.] (3.1 parts) (a small exotherm was observed after the addition). The mixture was then stirred at room temperature (about 25° C.) for one hour. The resulting reaction mixture was added dropwise in small portions to an aqueous solution containing sodium tetraphenyl borate (4.0 parts) and water (40 parts), and the mixture was stirred at room temperature (about 25° C.) for one hour. The aqueous phase was removed by a separation operation. The organic phase was washed with water three times, and the organic solvent was evaporated under reduced pressure. As a result, 7.1 parts of white solids were obtained. The white solids were recrystallized in acetonitrile, and 6.2 parts of a base generator (C122-1) was obtained (as white solids).

Preparation 10
[Synthesis of Base Generator (C122-2) {Compound Represented by Formula (36)}]

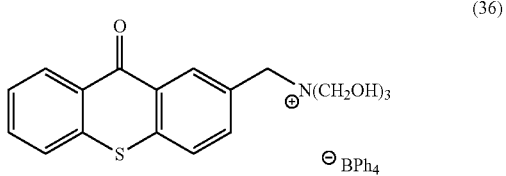

(1) Synthesis of methylthioxanthone [Intermediate (C122-2-1)]

Dithiosalicylic acid [product of Wako Pure Chemical Industries, Ltd.] (10 parts) was dissolved in sulfuric acid (139 parts), and the solution was stirred at room temperature (about 25° C.) for one hour and then cooled in an ice bath. Toluene (25 parts) was added dropwise in small portions to the cooled solution, while the temperature of the cooled solution was controlled to 20° C. or lower. Thereafter, the temperature was recovered to room temperature (about 25° C.), and the solution was further stirred for two hours. The resulting reaction mixture was added in small portions to water (815 parts), and precipitated yellow solids were filtered. The yellow solids were dissolved in dichloromethane (260 parts). To the resulting solution, water (150 parts) was added, and then 24% KOH aqueous solution (6.7 parts) was added to alkalinize the aqueous phase. After stirring the resulting mixture for one hour, the aqueous phase was removed by a separation operation, and the organic phase was washed with water (130 parts) three times. Then, the organic phase was dried over anhydrous sodium sulfate, and the organic solvent was evaporated under reduced pressure. As a result, 8.7 parts of an intermediate (C122-2-1) was obtained (as yellow solids). The intermediate (C122-2-1) was a mixture of 2-methylthioxanthone and 3-methylthioxanthone.

(2) Synthesis of 2-bromomethylthioxanthone [Intermediate (C122-2-2)]

The intermediate (C122-2-1) (2.1 parts) was dissolved in cyclohexane (120 parts), and N-bromosuccinimide [product of Wako Pure Chemical Industries, Ltd.] (8.3 parts) and benzoyl peroxide [product of Wako Pure Chemical Industries, Ltd.] (0.1 parts) were added to this solution. The resulting mixture was allowed to react under reflux for four hours (3-methylthioxanthone remained unreacted), and then the solvent (cyclohexane) was removed. The residue was redissolved in chloroform (50 parts), and this chloroform solution was washed with water (30 parts) three times. After the aqueous phase was removed by a separation operation, the organic solvent was evaporated under reduced pressure. As a result, 1.7 parts of brown solids were obtained. The solids were recrystallized in ethyl acetate (3-methylthioxanthone was separated in this step), and 1.5 parts of an intermediate (C122-2-2) was obtained (as yellow solids).

(3) Synthesis of N-(9-oxo-9H-thioxanthene-2-yl) methyl-N,N,N-tris(2-hydroxyethyl)ammonium bromide [intermediate (C122-2-3)]

The intermediate (C122-2-2) (2-bromomethylthioxanthone) (1.0 part) was dissolved in dichloromethane (85 g), and triethanol amine [product of Wako Pure Chemical industries, Ltd.] (0.5 parts) was added dropwise to this solution (an exotherm was observed after the addition). The resulting mixture was stirred at room temperature (about 25° C.) for one hour, and the organic solvent was evaporated under reduced pressure. As a result, 2.2 g of white solids were obtained. The white solids were recrystallized in a tetrahydrofuran/dichloromethane mixed solution, and 1.0 part of an intermediate (C122-2-3) was obtained (as brown solids).

(4) Synthesis of Base Generator (C122-2)

A solution of the intermediate (C122-2-3) (1.0 part dissolved in 50 parts of chloroform) was prepared beforehand and added dropwise in small portions to an aqueous solution of sodium tetraphenyl borate [product of Nacalai Tesque, Inc.] (0.8 parts dissolved in 17 parts of water). The resulting mixture was stirred at room temperature (about 25° C.) for one hour. The aqueous phase was removed by a separation operation, and the organic phase was washed with water (30 parts) three times. The organic solvent was evaporated under reduced pressure to afford yellow solids. The yellow solids were recrystallized in an acetonitrile/ether mixed solution, and 1.3 parts of a base generator (C122-2) was obtained (as a fine yellow powder).

Preparation 11
[Synthesis of Base Generator (C122-3) {Compound Represented by Formula (37)}]

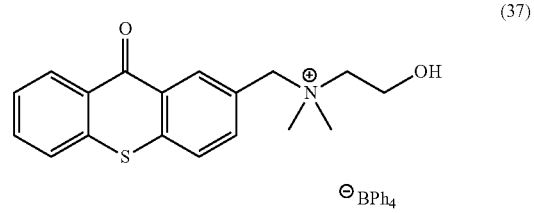 [SMILES: C[N+](C)(CCO)Cc1ccc2sc3ccccc3c(=O)c2c1 ; "BPh4"]

(1) Synthesis of N-(9-oxo-9H-thioxanthene-2-yl) methyl-N,N-dimethyl-N-(2-hydr oxyethyl)ammonium bromide [intermediate (C122-3-3)]

The same procedures as in (1) to (3) of Preparation 10 were used, except that "triethanol amine [product of Wako Pure Chemical industries, Ltd.] (0.5 parts)" was changed to "dimethylethanol amine [product of Wako Pure Chemical Industries, Ltd.] (0.3 parts)". As a result, 0.8 parts of an intermediate (C122-3-3) was obtained (as brown solids).

(2) Synthesis of Base Generator (C122-3)

The same procedures as in (4) of Preparation 10 were used, except that "the intermediate (C122-2-3) (1.0 part) was changed to "the intermediate (C122-3-3) (0.8 parts)". As a result, 1.0 part of a base generator (C122-3) was obtained (as a white powder).

Preparation 12
[Synthesis of Base Generator (C122-4) {Compound Represented by Formula (38)}]

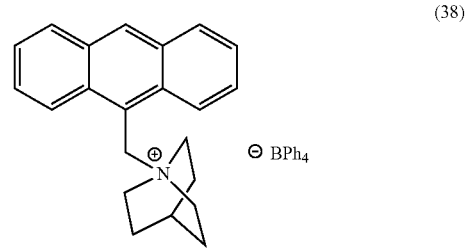 [SMILES: c1ccc2c(C[N+]34CCC(CC3)CC4)c3ccccc3cc2c1 ; "BPh4"]

The same procedures as in Preparation 9 were used, except that "trioctyl amine [product of Wako Pure Chemical industries, Ltd.] (3.1 parts)" was changed to "1-azabicyclo[2.2.2] octane (1.0 part)" As a result, 4.4 parts of a base generator (C122-4) was obtained (as white solids).

Preparation 13
[Synthesis of Base Generator (C123-1) {Compound Represented by Formula (39)}]

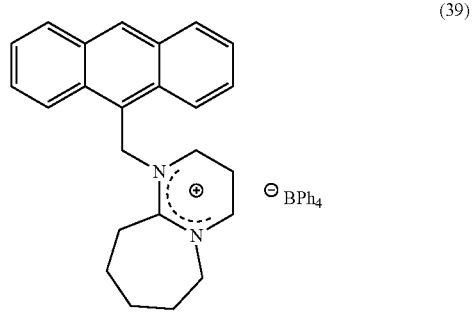 [SMILES: c1ccc2c(CN3CCCN4CCCCCC43)c3ccccc3cc2c1 ; "BPh4"]

The same procedures as in Preparation 9 were used, except that "trioctyl amine [product of Wako Pure Chemical Industries, Ltd.] (3.1 parts)" was changed to "1,8-diazabicyclo [5.4.0]-7-undecene ["DBU" produced by San-Apro Ltd.] (1.3 parts)". As a result, 4.7 parts of a base generator (C123-1) was obtained (as white solids).

Preparation 14
[Synthesis of Base Generator (C123-2) {Compound Represented by Formula (40)}]

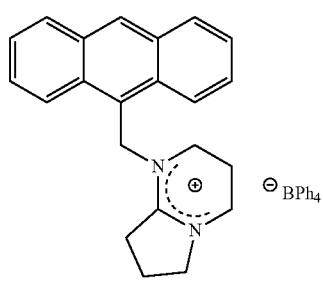

The same procedures as in Preparation 9 were used, except that "trioctyl amine [product of Wako Pure Chemical Industries, Ltd.] (3.1 parts)" was changed to "1,5-diazabicyclo [4.3.0]-5-nonene ["DBN" produced by San-Apro Ltd.] (1.1 parts)". As a result, 4.6 parts of a base generator (C123-2) was obtained (as white solids).

Preparation 15
[Synthesis of Base Generator (C123-3) {Compound Represented by Formula (41)}]

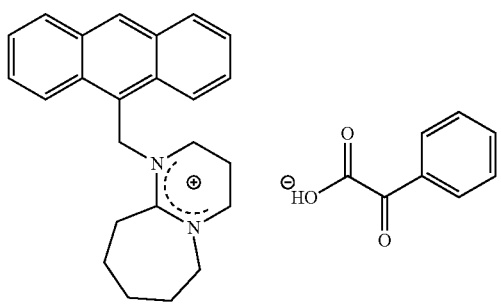

(1) Preparation of Silver Phenylglyoxylate:

Phenylglyoxylic acid (product of Aldrich) (3.9 parts) was dissolved in methanol (20 parts), and sodium hydroxide [product of Wako Pure Chemical Industries, Ltd.] (0.9 parts) was added in small portions to this solution (the neutralization was exothermic). The resulting mixture was stirred for one hour, and 1 mol/L silver nitrate aqueous solution [product of Wako Pure Chemical Industries, Ltd.] (10.4 parts) was added thereto. Precipitated grey solids were filtered, washed with methanol and dried. As a result, 4.4 parts of silver phenyl glyoxylate was obtained (as gray solids).

(2) Synthesis of Photobase Generator (C123-3):

9-Chloromethylanthracene (product of Aldrich) (2.0 parts) was dissolved in methanol (40 g), and 1,8-diazabicyclo [5.4.0]-7-undecene ["DBU" produced by San-Apro Ltd.] (1.3 parts) was added in small portions to this solution (an exotherm was observed after the addition). The resulting mixture was stirred at room temperature (about 25° C.) for one hour. The resulting reaction mixture was added dropwise in small portions to a dispersant containing silver phenylglyoxylate (3.0 parts) and methanol (20 parts), and the mixture was stirred at room temperature (about 25° C.) for one hour. Grey solids generated therein were removed by filtration, and the filtrate was evaporated under reduced pressure. As a result, 4.5 parts of brown solids were obtained. The brown solids were recrystallized in an ether/hexane mixed solution, and 2.6 parts of a photobase generator (C123-3) was obtained (as yellow solids).

Preparation 16
[Synthesis of Base Generator (C123-4) {Compound Represented by Formula (42)}]

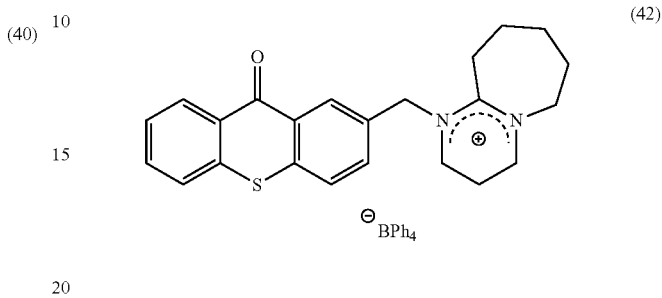

(1) Synthesis of 8-(9-oxo-9H-thioxanthene-2-yl) methyl-1,8-diazabicyclo[5.4.0]-7-undecenium bromide [intermediate (C123-4-3)]

The same procedures as in (1) to (3) of Preparation 10 were used, except that "triethanol amine [product of Wako Pure Chemical industries, Ltd.]" was changed to "1,8-diazabicyclo[5.4.0]-7-undecene ["DBU" produced by San-Apro Ltd.]". As a result, 2.2 parts of an intermediate (C123-4-3) was obtained (as white solids).

(2) Synthesis of Base Generator (C123-4)

The same procedures as in (4) of Preparation 10 were used, except that "the intermediate (C122-2-3)" was changed to "the intermediate (C123-4-3)". As a result, 1.3 parts of a base generator (C123-4) was obtained (as a pale white yellow powder).

Preparation 17
[Synthesis of Base Generator (C123-5) {Compound Represented by Formula (43)}]

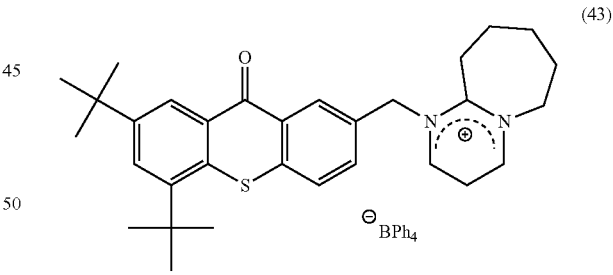

(1) Synthesis of 2,4-di-tert-butyl-7-methylthioxanthone [intermediate (C123-5-1)]

The intermediate (C122-2-1) (2.1 parts) was dissolved in dichloromethane (85 parts), and aluminum (III) chloride [product of Wako Pure Chemical Industries, Ltd.] (0.5 parts) and 2-chloro-2-methylpropane [product of Wako Pure Chemical Industries, Ltd.] (1.9 parts) were added to this solution. The resulting mixture was stirred at room temperature (about 25° C.) for 23 hours. The aqueous phase was removed by a separation operation, and the organic phase was washed with water (30 parts) three times. The organic solvent was evaporated under reduced pressure to afford pale yellow solids. The pale yellow solids were recrystallized in an ethyl acetate/hexane mixed solution, and 0.5 parts of an intermediate (C123-5-1) was obtained (as a yellow powder).

(2) Synthesis of 2,4-di-tert-butyl-7-bromomethylthioxanthone [intermediate (C123-5-2)]

The same procedures as in (2) of Preparation 10 were used, except that "the intermediate (C122-2-1) (2.1 parts)" was changed to "the intermediate (C123-5-1) (1.0 part)". As a result, 1.2 parts of an intermediate (C123-5-2) was obtained (as a yellow powder).

(3) Synthesis of 8-(2,4-di-tert-butyl-9-oxo-9H-thioxanthene-7-yl)methyl-1,8-diazabicyclo[5.4.0]-7-undecenium bromide [intermediate (C123-5-3)]

The same procedures as in (3) of Preparation 10 were used, except that "the intermediate (C122-2-2)" was changed to "the intermediate (C123-5-2)". As a result, 1.3 parts of an intermediate (C123-5-3) was obtained (as a fine yellow powder).

(4) Synthesis of Base Generator (C123-5)

The same procedures as in (4) of Preparation 10 were used, except that "the intermediate (C122-2-2) (1.0 part)" was changed to "the intermediate (C123-5-3) (0.8 parts)." As a result, 1.0 part of a base generator (C123-5) was obtained (as a fine yellow powder).

Preparation 18
[Synthesis of Base Generator (C123-6) {Compound Represented by Formula (44)}]

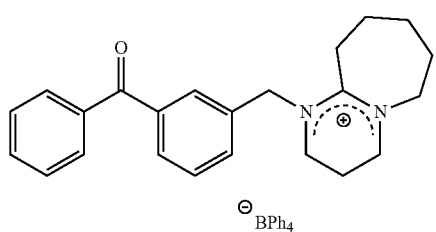

(44)

(1) Synthesis of 4-bromomethyl benzophenone [Intermediate (C123-6-1)]

4-Methyl benzophenone (product of Aldrich) (25.1 parts), N-bromo succinimide [product of Wako Pure Chemical industries, Ltd.] (22.8 parts), benzoyl peroxide [water content: 20%, product of Wako Pure Chemical Industries, Ltd.] (0.54 parts), and acetonitrile (80 parts) were mixed, heated to 80° C., and allowed to react for 2 hours under reflux. Subsequently, the resulting mixture was cooled, and the organic solvent was evaporated under reduced pressure. The residue was recrystallized in methanol (160 parts). As a result, 26 parts of an intermediate (C123-6-1) was obtained (as white crystals).

(2) Synthesis of 8-(4-benzoylphenyl)methyl-1,8-diazabicyclo[5.4.0]-7-undecen ium bromide [intermediate (C123-6-2)]

The intermediate (C123-6-1) (25.8 parts) were dissolved in acetonitrile (100 parts), and 1,8-diazabicyclo[5.4.0]-7-undecene ["DBU" produced by San-Apro Ltd.] (14.6 parts) was added dropwise to this solution (an exotherm was observed after the addition). The resulting mixture was stirred at room temperature (about 25° C.) for 18 hours, and the organic solvent was evaporated under reduced pressure. As a result, brown solids were obtained. The brown solids were recrystallized in acetonitrile, and 28.2 parts of an intermediate (C123-6-2) was obtained (as white solids).

(3) Synthesis of Base Generator (C123-6)

A solution of the intermediate (C123-6-2) (6.8 parts dissolved in 50 parts of chloroform) was prepared beforehand and added dropwise in small portions to a solution of sodium tetraphenyl borate [product of Nacalai Tesque, Inc.] (0.8 parts dissolved in 17 parts of water). The resulting mixture was stirred at room temperature (about 25° C.) for two hours. The resulting reaction mixture was filtered, and the filtrate was evaporated under reduced pressure to afford a yellow liquid. The yellow liquid was dissolved and recrystallized in acetonitrile. As a result, 7.6 parts of a base generator (C123-6) was obtained (as white solids).

Preparation 19
[Synthesis of Base Generator (C123-7) {Compound Represented by Formula (45)}]

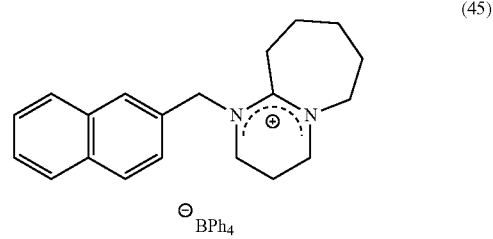 [SMILES: c1ccc2cc(CN3CCCN4CCCCCC43)ccc2c1 ; "BPh4"]

(45)

(1) Synthesis of 8-(9-naphthalylmethyl)-1,8-diazabicyclo[5.4.0]-7-undecenium bromide [(C123-7-1)]

The same procedures as in (2) of Preparation 18 were used, except that "the intermediate (C123-6-1) (25.8 parts)" was changed to "2-bromomethyl naphthalene [product of Tokyo Chemical Industry Co., Ltd.] (1.1 parts)". As a result, 1.3 parts of an intermediate (C123-7-1) was obtained (as a white powder).

(2) Synthesis of Base Generator (C123-7)

The same procedures as in (3) of Preparation 18 were used, except that "the intermediate (C123-6-2) (6.8 parts)" was changed to "the intermediate (C123-7-1) (0.8 parts)". As a result, 1.3 parts of a photobase generator (C123-7) was obtained (as a fine yellow powder).

Examples 1 to 21

Radical Polymerization with Use of Pigment

[Preparation of Photosensitive Composition]
<Preparation of High-Concentration Dispersion>
A mixture containing titanium oxide ("TIPAQUE R-930" produced by Ishihara Sangyo Ltd.) (43 parts) as a pigment, a pigment dispersant ("SOLSPERSE 32000" produced by The Lubrizol Corporation) (4 parts), and tetrahydrofurfuryl acrylate ["Light Acrylate THF-A" produced by Kyoeisha Chemical Co. Ltd.] (53 parts) as a radical polymerizable compound was kneaded with a ball mill for three hours. In this manner, a pigment dispersion (pigment concentration: 43%) was prepared.

<Preparation of Photosensitive Composition>

Photosensitive compositions (Q-1) to (Q-21) of the present invention were prepared by kneading the high-concentration pigment dispersion (47 parts), dipentaerythritol pentaacrylate ["neomer DA-600" produced by Sanyo Chemical Industries, Ltd.] (46 parts) as a radical polymerizable compound, diethylthioxanthone ["KAYACURE DETX-S" produced by Nippon Kayaku Co., Ltd.] (2 parts) as a sensitizer, and a radical generator (A) and acid generator(s) (B) or base generator(s) (C) shown in Table 1, using a ball mill at 25° C. for three hours. The amount of a radical generator (A) was 3 parts and the amount of acid generator(s) (B) or base generator(s) (C) was 2 parts.

In Example 9, 2 parts of (B) was composed of 1.5 parts of (B1) and 0.5 parts of (B3). In Example 21, 2 parts of (C) was composed of 1.5 parts of (C1) and 0.5 parts of (C3).

Lubrizol Corporation) (4 parts), and cyclohexene oxide (53 parts) as an ionic polymerizable compound was kneaded with a ball mill for three hours. In this manner, a pigment dispersion (pigment concentration: 43%) was prepared.

<Preparation of Photosensitive Composition>

Photosensitive compositions (Q-22) to (Q-27) of the present invention were prepared by kneading the high-concentration pigment dispersion (47 parts), cyclohexene oxide (46 parts) as an ionic polymerizable compound, diethylthioxanthone ["KAYACURE DETX-S" produced by Nippon Kayaku Co., Ltd.] (2 parts) as a sensitizer, and radical generator(s) (A) and acid generator(s) (B) shown in Table 2, using a ball

TABLE 1

| Examples | Radical generator (A) | | | Acid generator (B) | | | Base generator (C) | | |
|---|---|---|---|---|---|---|---|---|---|
| | (A1) | (A2) | (A3) | (B1) | (B2) | (B3) | (C1) | (C2) | (C3) |
| 1 | — | DAROCUR TPO | — | B122-1 | — | — | — | — | — |
| 2 | — | DAROCUR TPO | — | B122-2 | — | — | — | — | — |
| 3 | — | DAROCUR TPO | — | B122-3 | — | — | — | — | — |
| 4 | — | DAROCUR TPO | — | B122-4 | — | — | — | — | — |
| 5 | — | BPO | — | B121-1 | — | — | — | — | — |
| 6 | — | BPO | — | B121-2 | — | — | — | — | — |
| 7 | — | BPO | — | B121-3 | — | — | — | — | — |
| 8 | — | BPO | — | B121-4 | — | — | — | — | — |
| 9 | — | DAROCUR TPO | — | B122-1 | — | Cyclohexyl p-toluenesulfonate | — | — | — |
| 10 | — | — | BPO | — | — | — | C122-1 | — | — |
| 11 | — | — | BPO | — | — | — | C122-2 | — | — |
| 12 | — | — | BPO | — | — | — | C122-3 | — | — |
| 13 | — | — | BPO | — | — | — | C122-4 | — | — |
| 14 | — | — | DAROCUR TPO | — | — | — | C123-1 | — | — |
| 15 | — | — | DAROCUR TPO | — | — | — | C123-2 | — | — |
| 16 | — | — | DAROCUR TPO | — | — | — | C123-3 | — | — |
| 17 | — | — | DAROCUR TPO | — | — | — | C123-4 | — | — |
| 18 | — | — | DAROCUR TPO | — | — | — | C123-5 | — | — |
| 19 | — | — | DAROCUR TPO | — | — | — | C123-6 | — | — |
| 20 | — | — | DAROCUR TPO | — | — | — | C123-7 | — | — |
| 21 | — | — | DAROCUR TPO | — | — | — | C123-4 | — | 1-Fmoc-4-piperidone |

Examples 22 to 27

Cationic Polymerization with Use of Pigment

[Preparation of Photosensitive Composition]
<Preparation of High-Concentration Dispersion>

A mixture containing titanium oxide ("TIPAQUE R-930" produced by Ishihara Sangyo Ltd.) (43 parts) as a pigment, a pigment dispersant ("SOLSPERSE 32000" produced by The mill at 25° C. for three hours. The amount of radical generator(s) (A) was 3 parts and the amount of acid generator(s) (B) was 2 parts.

In Example 26, 2 parts of (B) was composed of 1.5 parts of (B2) and 0.5 parts of (B3). In Example 27, 2 parts of (B) was composed of 1 part of (B1), 0.5 parts of (B2) and 0.5 parts of (B3).

In Example 27, 3 parts of (A) was composed of 2 parts of (A1) and 1 part of (A2).

TABLE 2

| Examples | Radical generator (A) | | | Acid generator (B) | | | Base generator (C) | | |
|---|---|---|---|---|---|---|---|---|---|
| | (A1) | (A2) | (A3) | (B1) | (B2) | (B3) | (C1) | (C2) | (C3) |
| 22 | DAROCUR TPO | — | — | — | B122-1 | — | — | — | — |
| 23 | DAROCUR TPO | — | — | — | B122-2 | — | — | — | — |
| 24 | DAROCUR TPO | — | — | — | B122-3 | — | — | — | — |
| 25 | DAROCUR TPO | — | — | — | B122-4 | — | — | — | — |
| 26 | DAROCUR TPO | — | — | — | B122-1 | Cyclohexyl p-toluenesulfonate | — | — | — |
| 27 | DAROCUR TPO | BPO | — | B121-1 | B122-1 | Cyclohexyl p-toluenesulfonate | — | — | — |

Examples 28 to 34

Anionic Polymerization with Use of Pigment

[Preparation of Photosensitive Composition]
<Preparation of High-Concentration Dispersion>

A mixture containing titanium oxide ("TIPAQUE R-930" produced by Ishihara Sangyo Ltd.) (43 parts) as a pigment, a pigment dispersant ("SOLSPERSE 32000" produced by The Lubrizol Corporation) (4 parts), and cyclohexene oxide (53 parts) as an ionic polymerizable compound was kneaded with a ball mill for three hours. In this manner, a pigment dispersion (pigment concentration: 43%) was prepared.

<Preparation of Photosensitive Composition>

Photosensitive compositions (Q-28) to (Q-34) of the present invention were prepared by kneading the high-concentration pigment dispersion (47 parts), cyclohexene oxide (46 parts) as an ionic polymerizable compound, diethylthioxanthone ["KAYACURE DETX-S" produced by Nippon Kayaku Co., Ltd.] (2 parts) as a sensitizer, and radical generator(s) (A) and base generator(s) (C) shown in Table 3, using a ball mill at 25° C. for three hours. The amount of radical generator (s) (A) was 3 parts and the amount of base generator(s) (C) was 2 parts.

In Example 33, 2 parts of (C) was composed of 1 part of (C2) and 1 part of (C3).

In Example 34, 3 parts of (A) was composed of 2 parts of (A1) and 1 part of (A2), and 2 parts of (C) was composed of 1 part of (C1), 0.5 parts of (C2), and 0.5 parts of (C3).

TABLE 3

| Examples | Radical generator (A) | | | Acid generator (B) | | | Base generator (C) | | |
|---|---|---|---|---|---|---|---|---|---|
| | (A1) | (A2) | (A3) | (B1) | (B2) | (B3) | (C1) | (C2) | (C3) |
| 28 | DAROCUR TPO | — | — | — | — | — | — | C122-2 | — |
| 29 | DAROCUR TPO | — | — | — | — | — | — | C122-3 | — |
| 30 | DAROCUR TPO | — | — | — | — | — | — | C123-4 | — |
| 31 | DAROCUR TPO | — | — | — | — | — | — | C123-5 | — |
| 32 | DAROCUR TPO | — | — | — | — | — | — | C123-6 | — |
| 33 | DAROCUR TPO | — | — | — | — | — | — | C123-4 | 1-Fmoc-4-piperidone |
| 34 | DAROCUR TPO | BPO | — | — | — | — | C123-1 | C123-4 | 1-Fmoc-4-piperidone |

Examples 35 to 68

Use of Dye

Photosensitive compositions (Q-35) to (Q-68) of the present invention were prepared in the same manner as in Examples 1 to 34, except that "titanium oxide" was changed to "C.I. Direct blue-14" [produced by Tokyo Chemical Industry Co., Ltd.].

Comparative Examples 1 and 2

Radical Polymerization with Use of Pigment

Photosensitive compositions (Q'-1) and (Q'-2) for comparison were prepared in the same manner as in Example 1, except that a radical generator (A) shown in Table 4 was used in an amount of 5 parts as the radical generator (A) without using the acid generator (B).

TABLE 4

| Comparative Examples | Radical generator (A) | | | Acid generator (B) | | | Base generator (C) | | |
|---|---|---|---|---|---|---|---|---|---|
| | (A1) | (A2) | (A3) | (B1) | (B2) | (B3) | (C1) | (C2) | (C3) |
| 1 | DAROCUR TPO | — | — | — | — | — | — | — | — |
| 2 | BPO | — | — | — | — | — | — | — | — |

Comparative Examples 3 to 8

Cationic Polymerization with Use of Pigment

Photosensitive compositions (Q'-3) to (Q'-8) for comparison were prepared in the same manner as in Examples 22 to 27, except that acid generator(s) (B) shown in Table 5 was/were used in an amount of 5 parts as the acid generator (B) without using the radical generator (A).

In Comparative Example 7, 5 parts of (B) was composed of 3.75 parts of (B2) and 1.25 parts of (B3). In Comparative Example 8, 5 parts of (B) was composed of 2.5 parts of (B1), 1.25 parts of (B2), and 1.25 parts of (B3).

TABLE 5

| Comparative | Radical generator (A) | | | Acid generator (B) | | | Base generator (C) | | |
|---|---|---|---|---|---|---|---|---|---|
| Examples | (A1) | (A2) | (A3) | (B1) | (B2) | (B3) | (C1) | (C2) | (C3) |
| 3 | — | — | — | B122-1 | — | — | — | — | — |
| 4 | — | — | — | B122-2 | — | — | — | — | — |
| 5 | — | — | — | B122-3 | — | — | — | — | — |
| 6 | — | — | — | B122-4 | — | — | — | — | — |
| 7 | — | — | — | B122-1 | — | Cyclohexyl p-toluenesulfonate | — | — | — |
| 8 | — | — | — | B121-1 | B122-1 | Cyclohexyl p-toluenesulfonate | — | — | — |

Comparative Examples 9 to 15

Anionic Polymerization with Use of Pigment

Photosensitive compositions (Q'-9) to (Q'-15) for comparison were prepared in the same manner as in Examples 28 to 34, except that base generator(s) (C) shown in Table 6 was/were used in an amount of 5 parts as the base generator (C) without using the radical generator (A).

In Comparative Example 14, 5 parts of (C) was composed of 3.75 parts of (C1) and 1.25 parts of (C3). In Comparative Example 15, 5 parts of (C) was composed of 2.5 parts of (C1), 1.25 parts of (C2), and 1.25 parts of (C3).

TABLE 6

| Comparative | Radical generator (A) | | | Acid generator (B) | | | Base generator (C) | | |
|---|---|---|---|---|---|---|---|---|---|
| Examples | (A1) | (A2) | (A3) | (B1) | (B2) | (B3) | (C1) | (C2) | (C3) |
| 9 | — | — | — | — | — | — | C122-2 | — | — |
| 10 | — | — | — | — | — | — | C122-3 | — | — |
| 11 | — | — | — | — | — | — | C123-4 | — | — |
| 12 | — | — | — | — | — | — | C123-5 | — | — |
| 13 | — | — | — | — | — | — | C123-6 | — | — |
| 14 | — | — | — | — | — | — | C123-4 | — | 1-Fmoc-4-piperidone |
| 15 | — | — | — | — | — | — | C123-1 | C123-4 | 1-Fmoc-4-piperidone |

Comparative Examples 16-30

Use of Dye

Photosensitive compositions (Q'-16) to (Q'-30) were prepared in the same manner as in Comparative Examples 1 to 15, except that "titanium oxide" was changed to "C.I. Direct blue-14" [produced by Tokyo Chemical industry Co., Ltd.].

Comparative Example 31

Cationic Polymerization with Use of Radical Initiator and Acid Generator that do not React with Each Other in System Including Pigment A photosensitive composition (Q'-31) was prepared in the same manner as in Example 22, except that the acid generator (B) shown in Table 2 was changed to the acid generator (B) shown in Table 7.

TABLE 7

| Comparative Example | Radical generator (A) | | | Acid generator (B) | | | Base generator (C) | | |
|---|---|---|---|---|---|---|---|---|---|
| | (A1) | (A2) | (A3) | (B1) | (B2) | (B3) | (C1) | (C2) | (C3) |
| 31 | DAROCUR TPO | — | — | — | — | Cyclohexyl p-toluenesulfonate | — | — | — |

Regarding the compounds shown in Tables 1 to 7, DAROCUR TPO (2,4,6-trimethylbenzoyl-diphenyl-phosphine oxide) as (A1231) was a product of Ciba Japan K.K.; 1-Fmoc-4-piperidone as (C31) was a product of ALDRICH; BPO (benzoyl peroxide) as (A231) was "NYPER BW" produced by NOF CORPORATION; and cyclohexyl p-toluenesulfonate as (B31) was a product of Tokyo Chemical Industry Co., Ltd.

[Evaluation of Cured Condition of Coating]

Each of the photosensitive compositions prepared in Examples 1 to 68 and Comparative Examples 1 to 31 was applied to a surface treated PET (polyethylene terephthalate) film having a thickness of 100 μm [COSMOSHINE A4300 produced by Toyobo Co., Ltd.] using an applicator to form a 20- or 80-μm thick coating. The two irradiators shown below were used for light irradiation.

(1) UV Irradiator of a Belt Conveyor Type (Eye Graphics Co. Ltd., "ECS-151U")

The 365 nm exposure dose was 150 mJ/cm$^2$.

(2) LED Irradiator of a Spot Type ("RX FireFlex" Produced by Phoseon Technology)

The exposure dose was 150 mJ/cm$^2$.

The cured condition of cured coatings was evaluated by touching them with fingers and scratching them with nails immediately after exposure to light. The results based on the following criteria are set out in Table 8.

++: No tuck and no scratch by nails on the surface
+: No tuck but scratches by nails on the surface
±: Tucks and scratches by nails on the surface
−: Not cured

TABLE 8

| Examples | Evaluation of cured condition Irradiator: ECS-151U | Irradiator: RX FireFlex | Comparative Examples | Evaluation of cured condition Irradiator: ECS-151U | Irradiator: RX FireFlex |
|---|---|---|---|---|---|
| 1 | ++ | ++ | 1 | ± | − |
| 2 | ++ | ++ | 2 | ± | − |
| 3 | ++ | ++ | 3 | ± | − |
| 4 | ++ | + | 4 | ± | − |
| 5 | ++ | + | 5 | ± | − |
| 6 | ++ | + | 6 | ± | − |
| 7 | ++ | + | 7 | ± | − |
| 8 | + | + | 8 | ± | − |
| 9 | ++ | ++ | 9 | − | − |
| 10 | + | + | 10 | − | − |
| 11 | + | + | 11 | ± | − |
| 12 | + | + | 12 | ± | − |
| 13 | ++ | + | 13 | ± | − |
| 14 | ++ | + | 14 | ± | − |
| 15 | ++ | + | 15 | ± | − |
| 16 | ++ | + | 16 | ± | − |
| 17 | ++ | ++ | 17 | ± | − |
| 18 | ++ | ++ | 18 | ± | − |
| 19 | ++ | ++ | 19 | ± | − |
| 20 | ++ | + | 20 | ± | − |
| 21 | ++ | ++ | 21 | ± | − |
| 22 | ++ | ++ | 22 | ± | − |
| 23 | ++ | ++ | 23 | ± | − |
| 24 | ++ | ++ | 24 | − | − |
| 25 | ++ | + | 25 | − | − |
| 26 | ++ | ++ | 26 | ± | − |
| 27 | ++ | ++ | 27 | ± | − |
| 28 | + | + | 28 | ± | − |
| 29 | + | + | 29 | ± | − |
| 30 | ++ | ++ | 30 | ± | − |
| 31 | ++ | ++ | 31 | − | − |
| 32 | ++ | + | | | |
| 33 | ++ | ++ | | | |
| 34 | ++ | ++ | | | |
| 35 | ++ | ++ | | | |
| 36 | ++ | ++ | | | |
| 37 | ++ | ++ | | | |
| 38 | ++ | + | | | |
| 39 | ++ | + | | | |
| 40 | ++ | + | | | |
| 41 | ++ | + | | | |
| 42 | + | + | | | |
| 43 | ++ | ++ | | | |
| 44 | + | + | | | |
| 45 | + | + | | | |
| 46 | + | + | | | |
| 47 | ++ | + | | | |
| 48 | ++ | + | | | |
| 49 | ++ | + | | | |
| 50 | ++ | + | | | |
| 51 | ++ | ++ | | | |
| 52 | ++ | ++ | | | |
| 53 | ++ | ++ | | | |
| 54 | ++ | + | | | |
| 55 | ++ | ++ | | | |
| 56 | ++ | ++ | | | |
| 57 | ++ | ++ | | | |
| 58 | ++ | ++ | | | |
| 59 | ++ | + | | | |
| 60 | ++ | ++ | | | |
| 61 | ++ | ++ | | | |
| 62 | + | + | | | |
| 63 | + | + | | | |
| 64 | ++ | ++ | | | |
| 65 | ++ | ++ | | | |
| 66 | ++ | + | | | |
| 67 | ++ | ++ | | | |
| 68 | ++ | ++ | | | |

Production of Ceramic Green Sheet

Examples 69 to 89

Use of Metal Oxide Powder (F)

<Preparation of Photosensitive Composition>

Photosensitive compositions (Q-69) to (Q-89) of the present invention were prepared by kneading a barium titanate powder ["BT-03" produced by Sakai Chemical Industry Co., Ltd.] (80 parts), polyethylene glycol diacrylate ["NK ester A-600" produced by Shin Nakamura Chemical Co., Ltd.] (13 parts) as a radical polymerizable compound, diethyl thioxanthone ["KAYACURE DETX-S"] produced by Nippon Kayaku Co., Ltd. (1 part) as a sensitizer, IONET DO-1000 [product of Sanyo Chemical Industries, Ltd.] (1 part) as a dispersant, and a radical generator (A) and acid generator(s) (B) or base generator(s) (C) shown in Table 9, using a ball mill at 25° C. for three hours. The amount of a radical generator (A) was 3 parts and the amount of acid generator(s) (B) or base generator(s) (C) was 2 parts.

In Example 77, 2 parts of (B) was composed of 1.5 parts of (B1) and 0.5 parts of (B3). In Example 89, 2 parts of (C) was composed of 1.5 parts of (C1) and 0.5 parts of (C3).

[Evaluation of Cured Condition of Coating (Ceramic Green Sheet)]

Each of the photosensitive compositions prepared in Examples 69 to 89 and Comparative Examples 32 and 33 was applied to a surface treated PET (polyethylene terephthalate) film having a thickness of 100 μm [COSMOSHINE A4300 produced by Toyobo Co., Ltd.] using an applicator to form a 20- or 80-μm thick coating. The two irradiators shown below were used for light irradiation.

(1) UP irradiator of a belt conveyor type (Eye Graphics Co. Ltd., "ECS-151U")

The 365 nm exposure dose was 150 mJ/cm$^2$.

(2) LED irradiator of a spot type ("RX FireFlex" by Phoseon Technology)

The exposure dose was 150 mJ/cm$^2$.

TABLE 9

| Examples | Radical generator (A) | | | Acid generator (B) | | | Base generator (C) | | |
|---|---|---|---|---|---|---|---|---|---|
| | (A1) | (A2) | (A3) | (B1) | (B2) | (B3) | (C1) | (C2) | (C3) |
| 69 | — | DAROCUR TPO | — | B122-1 | — | — | — | — | — |
| 70 | — | DAROCUR TPO | — | B122-2 | — | — | — | — | — |
| 71 | — | DAROCUR TPO | — | B122-3 | — | — | — | — | — |
| 72 | — | DAROCUR TPO | — | B122-4 | — | — | — | — | — |
| 73 | — | BPO | — | B121-1 | — | — | — | — | — |
| 74 | — | BPO | — | B121-2 | — | — | — | — | — |
| 75 | — | BPO | — | B121-3 | — | — | — | — | — |
| 76 | — | BPO | — | B121-4 | — | — | — | — | — |
| 77 | — | DAROCUR TPO | — | B122-1 | — | Cyclohexyl p-toluenesulfonate | — | — | — |
| 78 | — | — | BPO | — | — | — | C122-1 | — | — |
| 79 | — | — | BPO | — | — | — | C122-2 | — | — |
| 80 | — | — | BPO | — | — | — | C122-3 | — | — |
| 81 | — | — | BPO | — | — | — | C122-4 | — | — |
| 82 | — | — | DAROCUR TPO | — | — | — | C123-1 | — | — |
| 83 | — | — | DAROCUR TPO | — | — | — | C123-2 | — | — |
| 84 | — | — | DAROCUR TPO | — | — | — | C123-3 | — | — |
| 85 | — | — | DAROCUR TPO | — | — | — | C123-4 | — | — |
| 86 | — | — | DAROCUR TPO | — | — | — | C123-5 | — | — |
| 87 | — | — | DAROCUR TPO | — | — | — | C123-6 | — | — |
| 88 | — | — | DAROCUR TPO | — | — | — | C123-7 | — | — |
| 89 | — | — | DAROCUR TPO | — | — | — | C123-4 | — | 1-Fmoc-4-piperidone |

Comparative Examples 32 and 33

Use of Metal Oxide Powder (F)

Photosensitive compositions for comparison (Q'-32) and (Q'-33) were prepared in the same manner as in Example 69, except that a radical generator (A) shown in Table 10 was used in an amount of 5 parts as the radical generator (A) without using the acid generator (B).

The cured condition of cured coatings was evaluated by touching them with fingers and scratching them with nails immediately after exposure to light. The results based on the following criteria are set out in Table 11.

++: No tuck and no scratch by nails on the surface
+: No tuck but scratches by nails on the surface
±: Tucks and scratches by nails on the surface
−: Not cured

TABLE 10

| Comparative Examples | Radical generator (A) | | | Acid generator (B) | | | Base generator (C) | | |
|---|---|---|---|---|---|---|---|---|---|
| | (A1) | (A2) | (A3) | (B1) | (B2) | (B3) | (C1) | (C2) | (C3) |
| 32 | DAROCUR TPO | — | — | — | — | — | — | — | — |
| 33 | BPO | — | — | — | — | — | — | — | — |

TABLE 11

| Examples | Evaluation of cured condition Irradiator: ECS-151U | Evaluation of cured condition Irradiator: RX FireFlex | Comparative Examples | Evaluation of cured condition Irradiator: ECS-151U | Evaluation of cured condition Irradiator: RX FireFlex |
|---|---|---|---|---|---|
| 69 | ++ | ++ | 32 | ± | − |
| 70 | ++ | ++ | 33 | ± | − |
| 71 | ++ | ++ | | | |
| 72 | ++ | + | | | |
| 73 | ++ | + | | | |
| 74 | ++ | + | | | |
| 75 | ++ | + | | | |
| 76 | + | + | | | |
| 77 | ++ | ++ | | | |
| 78 | + | + | | | |
| 79 | + | + | | | |
| 80 | + | + | | | |
| 81 | ++ | + | | | |
| 82 | ++ | + | | | |
| 83 | ++ | + | | | |
| 84 | ++ | + | | | |
| 85 | ++ | ++ | | | |
| 86 | ++ | ++ | | | |
| 87 | ++ | ++ | | | |
| 88 | ++ | + | | | |
| 89 | ++ | ++ | | | |

Formation of Electrode Layer

Examples 90 to 110

Use of Metal Powder (G)

Photosensitive compositions (Q-90) to (Q-110) were prepared in the same manner as in Examples 69 to 89, except that "the barium titanate powder" was changed to "a palladium powder ["SFP-030" produced by Sumitomo Metal Mining Co., Ltd.]".

Comparative Examples 34 and 35

Use of Metal Powder (G)

Photosensitive compositions (Q'-34) and (Q'-35) were prepared in the same manner as in Comparative Examples 32 and 33, except that "the barium titanate powder" was changed to "a palladium powder ["SFP-030" produced by Sumitomo Metal Mining Co., Ltd.]".

[Evaluation of Cured Condition of Coating (Electrode Layer)]

Each of the photosensitive compositions prepared in Examples 90 to 110 and Comparative Examples 34 and 35 was applied to a surface treated PET (polyethylene terephthalate) film having a thickness of 100 μm [COSMOSHINE A4300 produced by Toyobo Co., Ltd.] using an applicator to form a 20- or 80-μm thick coating. The two irradiators shown below were used for light irradiation.

(1) UV Irradiator of a Belt Conveyor type (Eye Graphics Co. Ltd., "ECS-151U")

The 365 nm exposure dose was 150 mJ/cm$^2$.

(2) LED Irradiator of a Spot Type ("RX FireFlex" by Phoseon Technology)

The exposure dose was 150 mJ/cm$^2$.

The cured condition of cured coatings was evaluated by touching them with fingers and scratching them with nails immediately after exposure to light. The results based on the following criteria are set out in Table 12.

++: No tuck and no scratch by nails on the surface
+: No tuck but scratches by nails on the surface
±: Tucks and scratches by nails on the surface
−: Not cured

TABLE 12

| Examples | Evaluation of cured condition Irradiator: ECS-151U | Evaluation of cured condition Irradiator: RX FireFlex | Comparative Examples | Evaluation of cured condition Irradiator: ECS-151U | Evaluation of cured condition Irradiator: RX FireFlex |
|---|---|---|---|---|---|
| 90 | ++ | ++ | 34 | ± | − |
| 91 | ++ | ++ | 35 | ± | − |
| 92 | ++ | ++ | | | |
| 93 | ++ | + | | | |
| 94 | ++ | + | | | |
| 95 | ++ | + | | | |
| 96 | ++ | + | | | |
| 97 | + | + | | | |
| 98 | ++ | ++ | | | |
| 99 | + | + | | | |
| 100 | + | + | | | |
| 101 | + | + | | | |
| 102 | ++ | + | | | |
| 103 | ++ | + | | | |
| 104 | ++ | + | | | |
| 105 | ++ | + | | | |
| 106 | ++ | ++ | | | |
| 107 | ++ | ++ | | | |
| 108 | ++ | ++ | | | |
| 109 | ++ | + | | | |
| 110 | ++ | ++ | | | |

[Evaluation of Laminated Ceramic Capacitors]

A green sheet was formed by applying the photosensitive composition of Example 69 by the doctor blade technique, and curing the composition by exposure to light. Next, the photosensitive composition of Example 90 was printed thereon by silk screening, and then cured by exposure to light. A 30-layer laminate of these was formed, and the layers were bonded to one another under a pressure of 49 MPa. The laminate was cut into chips of a predetermined size. The chips were degreased at 350° C. for four hours and then sintered at 1320° C. for two hours. External electrodes were formed on the sintered chips. In this manner, laminated ceramic capacitors were formed. No problem was found in the capacitors in the measurement of the capacitance in accordance with JIS C 5101-1-1998. No abnormality was detected by internal and external defect observation using an optical microscope.

INDUSTRIAL APPLICABILITY

The photosensitive composition of the present invention is remarkably useful as a coating material, an ink (e.g. UV printing ink, UV inkjet printing ink), a paint, an adhesive, and a material for ceramic electric devices because it enables thick coatings to be cured by a small amount of energy even if it has a high colorant concentration.

The invention claimed is:
1. A photosensitive composition comprising:
(1) a radical initiator (A);
(2) an acid generator (B) or a base generator (C);
(3) a polymerizable substance (D); and
(4) a colorant (E), a metal oxide powder (F), or a metal powder (G),
wherein at least one of the radical initiator (A), the acid generator (B), and the base generator (C) generates an active species (H) on exposure to active rays, the active species (H) reacts with the radical initiator (A), the acid generator (B), or the base generator (C) to generate another active species (I),
the active species (I) in turn causes the polymerizable substance (D) to be polymerized, and
the active species (H) or (I) is an acid or a base,
wherein the active species (H) is different from the active species (I).

2. The photosensitive composition according to claim 1, wherein the radical initiator (A) is a radical initiator (A1) that generates radicals on exposure to active rays, a radical initiator (A2) that generates radicals on exposure to an acid, or a radical initiator (A3) that generates radicals on exposure to a base,
the acid generator (B) is an acid generator (B1) that generates an acid on exposure to active rays, an acid generator (B2) that generates an acid on exposure to radicals, or an acid generator (B3) that generates an acid on exposure to an acid,
the base generator (C) is a base generator (C1) that generates a base on exposure to active rays, a base generator (C2) that generates a base on exposure to radicals, or a base generator (C3) that generates a base on exposure to a base, and
the photosensitive composition contains any one of the following combinations (1) to (10) of (A1) to (A3), (B1) to (B3), and (C1) to (C3):
(1) (A1) and (B2);
(2) (A1), (B2), and (B3);
(3) (B1) and (A2);
(4) (B1), (A2), and (B3);
(5) (C1) and (A3);
(6) (C1), (A3), and (C3);
(7) (A1) and (C2);
(8) (A1), (C2), and (C3);
(9) a combination of two or more of the combinations (1) to (4); and
(10) a combination of two or more of the combinations (5) to (8).

3. The photosensitive composition according to claim 2, wherein the radical initiator (A1) that generates radicals on exposure to active rays, the radical initiator (A2) that generates radicals on exposure to an acid, or the radical initiator (A3) that generates radicals on exposure to a base is at least one radical polymerization initiator selected from the group consisting of acylphosphine oxide derivative-based polymerization initiators (A1231), α-aminoacetophenone derivative-based polymerization initiators (A1232), benzyl ketal derivative-based polymerization initiators (A1233), α-hydroxyacetophenone derivative-based polymerization initiators (A1234), benzoin derivative-based polymerization initiators (A1235), oxime ester derivative-based polymerization initiators (A1236), and titanocene derivative-based polymerization initiators (A1237).

4. The photosensitive composition according to claim 2, wherein the radical initiator (A2) that generates radicals on exposure to an acid or the radical initiator (A3) that generates radicals on exposure to a base is an organic peroxide-based polymerization initiator (A231) and/or an azo-based polymerization initiator (A232).

5. The photosensitive composition according to claim 2, wherein the acid generator (B1) that generates an acid on exposure to active rays or the acid generator (B2) that generates an acid on exposure to radicals is a sulfonium salt derivative (B121) and/or an iodonium salt derivative (B122).

6. The photosensitive composition according to claim 5, wherein the sulfonium salt derivative (B121) is a compound represented by the following formula (1) or (2):

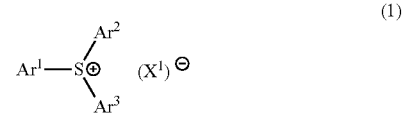

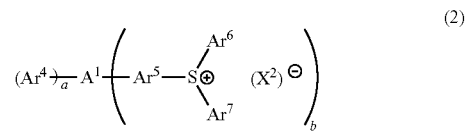

wherein $A^1$ is a divalent or trivalent group represented by any one of the following formulas (3) to (10); $Ar^1$ to $Ar^7$ are individually an aromatic hydrocarbon or heterocyclic group with at least one benzene ring, and are optionally substituted by at least one atom or substituent selected from the group consisting of halogens, and C1-C20 acyl, C1-C20 alkyl, C1-C20 alkoxy, C1-C20 alkylthio, C1-C20 alkylsilyl, nitro, carboxyl, hydroxyl, mercapto, amino, cyano, phenyl, naphthyl, phenoxy, and phenylthio groups; $Ar^1$ to $Ar^4$, $Ar^6$, and $Ar^7$ are each a monovalent group, and $Ar^5$ is a divalent group; $(X^1)^-$ and $(X^2)^-$ are each a negative ion; and a is an integer of 0 to 2, b is an integer of 1 to 3, and (a+b) is 2 or 3 and is the same as the valence of $A^1$:

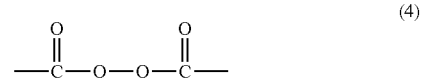

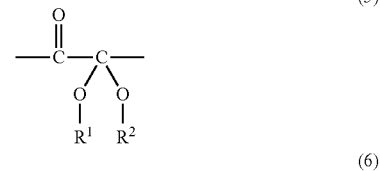

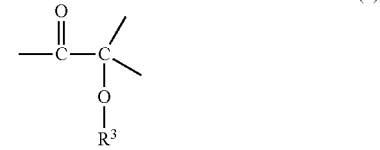

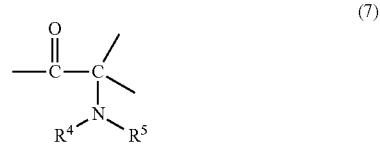

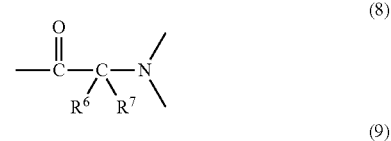

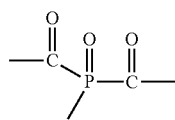
(10)

wherein $R^1$ to $R^7$ are individually a hydrogen, a C1-C20 alkyl group, or a phenyl group optionally substituted by at least one atom or substituent selected from the group consisting of halogens, and C1-C20 acyl, C1-C20 alkyl, amino, cyano, phenyl, naphthyl, phenoxy, and phenylthio groups; and $R^1$, $R^4$, and $R^6$ may optionally link to $R^2$, $R^5$, and $R^7$, respectively, to form a ring structure.

7. The photosensitive composition according to claim 5,
wherein the sulfonium salt derivative (B121) is a compound represented by the following formulas (11) to (14):

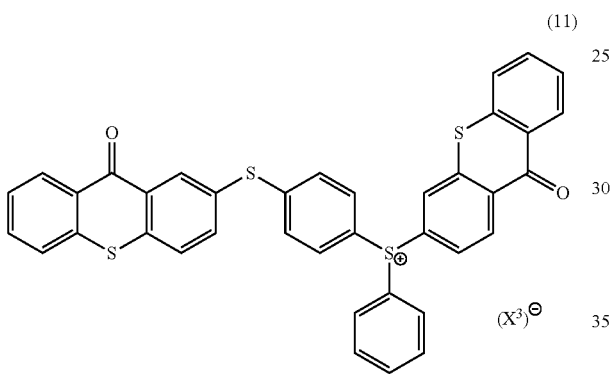
(11)

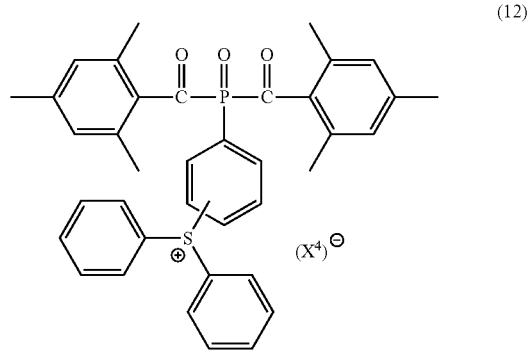
(12)

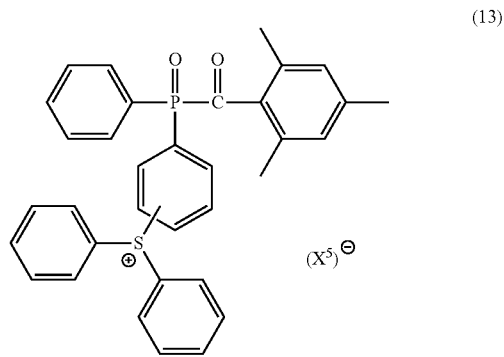
(13)

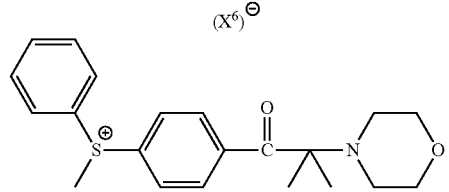
(14)

wherein $(X^3)^-$ to $(X^6)^-$ are each a negative ion.

8. The photosensitive composition according to claim 5,
wherein the iodonium salt derivative (B122) is a compound represented by the following formula (15) or (16):

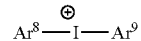
(15)

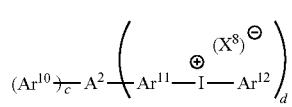
(16)

wherein $A^2$ is a divalent or trivalent group represented by any one of the formulas (3) to (10); $Ar^8$ to $Ar^{12}$ are individually an aromatic hydrocarbon or heterocyclic group with at least one benzene ring, and are optionally substituted by at least one atom or substituent selected from the group consisting of halogens, and C1-C20 acyl, C1-C20 alkyl, C1-C20 alkoxy, C1-C20 alkylthio, C1-C20 alkylsilyl, nitro, carboxyl, hydroxyl, mercapto, amino, cyano, phenyl, naphthyl, phenoxy, and phenylthio groups; $Ar^8$ to $Ar^{10}$ and $Ar^{12}$ are each a monovalent group, and $Ar^{11}$ is a divalent group; $(X^7)^-$ and $(X^8)^-$ are each a negative ion; and c is an integer of 0 to 2, d is an integer of 1 to 3, and (c+d) is 2 or 3 and is the same as the valence of $A^2$.

9. The photosensitive composition according to claim 5,
wherein the iodonium salt derivative (B122) is a compound represented by any one of the following formulas (17) to (20):

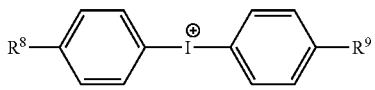
(17)

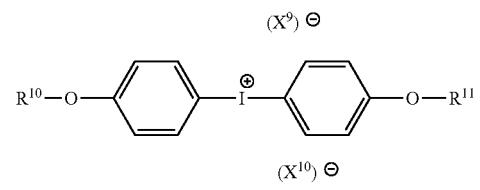
(18)

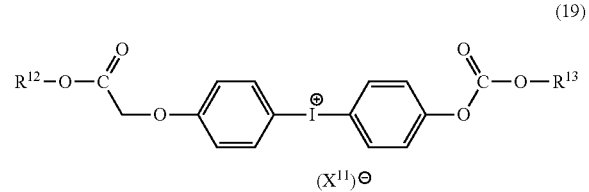
(19)

-continued

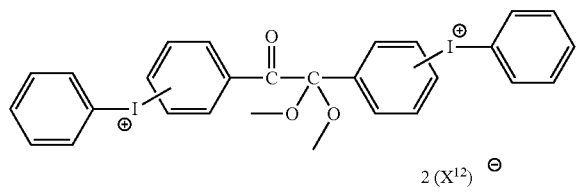

(20)

wherein $R^8$ to $R^{13}$ are each an atom or substituent selected from the group consisting of hydrogen, halogens, and C1-C20 acyl, C1-C20 alkyl, C1-C20 alkoxy, C1-C20 alkylthio, C1-C20 alkylsilyl, nitro, carboxyl, hydroxyl, mercapto, amino, cyano, phenyl, and naphthyl groups; and $(X^9)^-$ to $(X^9)^-$ are each a negative ion.

10. The photosensitive composition according to claim 2, wherein the acid generator (B3) that generates an acid on exposure to an acid is at least one acid generator selected from the group consisting of sulfonic acid ester derivatives (B31), acetic acid ester derivatives (B32), and phosphonic acid esters (B33).

11. The photosensitive composition according to claim 2, wherein the base generator (C1) that generates a base on exposure to active rays or the base generator (C2) that generates a base on exposure to radicals is at least one base generator selected from the group consisting of oxime derivatives (C121), quaternary ammonium salt derivatives (C122), and quaternary amidine salt derivatives (C123).

12. The photosensitive composition according to claim 2, wherein the base generator (C1) that generates a base on exposure to active rays or the base generator (C2) that generates a base on exposure to radicals is a compound represented by any one of the following formulas (21) to (23):

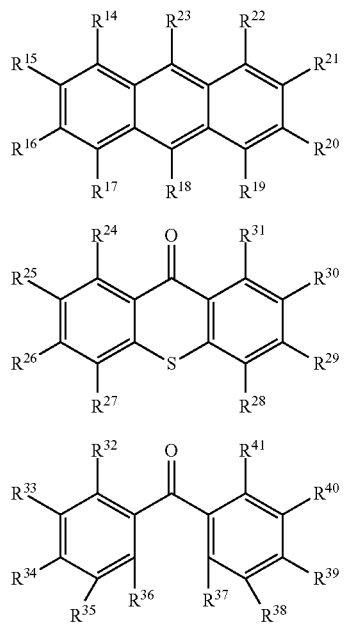

(21)

(22)

(23)

wherein $R^{14}$ to $R^{41}$ are individually an atom or substituent selected from the group consisting of hydrogen, halogens, C1-C20 acyl, C1-C20 alkyl, C1-C20 alkoxy, C1-C20 alkylthio, C1-C20 alkylsilyl, nitro, carboxyl, hydroxyl, mercapto, amino, cyano, phenyl, and naphthyl groups, substituents represented by the following formula (24), and substituents represented by the following formula (25); at least one of $R^{14}$ to $R^{23}$ is a substituent represented by the formula (24) or (25); at least one of $R^{24}$ to $R^{31}$ is a substituent represented by the formula (24) or (25); and at least one of $R^{32}$ to $R^{41}$ is a substituent represented by the formula (24) or (25):

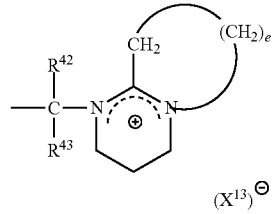

(24)

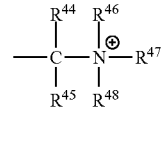

(25)

wherein $R^{42}$ to $R^{45}$ are each a hydrogen or C1-C20 alkyl group; $R^{46}$ to $R^{48}$ are each a C1-C20 alkyl group optionally substituted by a hydroxyl group; $(X^{13})^-$ and $(X^{14})^-$ are each a negative ion; and e is an integer of 2 to 4.

13. The photosensitive composition according to claim 2, wherein the base generator (C1) that generates a base on exposure to active rays or the base generator (C2) that generates a base on exposure to radicals is a compound represented by the formula (26):

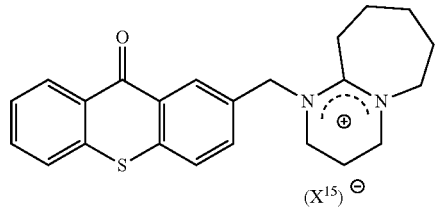

(26)

wherein $(X^{15})^-$ is a negative ion.

14. The photosensitive composition according to claim 2, wherein the base generator (C3) that generates a base on exposure to a base is a carbamate derivative (C31).

15. The photosensitive composition according to claim 1, wherein the polymerizable substance (D) is a radical polymerizable compound (D1) and/or an ionic polymerizable compound (D2).

16. The photosensitive composition according to claim 15, wherein the radical polymerizable compound (D1) is at least one polymerizable substance selected from the group consisting of C3-C35 acryl amide compounds (D11), C4-C35 (meth)acrylate compounds (D12), C6-C35 aromatic vinyl compounds (D13), and C3-C20 vinyl ether compounds (D14).

17. The photosensitive composition according to claim 15, wherein the ionic polymerizable compound (D2) is a C3-C20 epoxy compound (D21) and/or a C4-C20 oxetane compound (D22).

18. The photosensitive composition according to claim 1, which is used for a coating material, an ink, a paint, or an adhesive, or for production of a ceramic electric component.

* * * * *

UNITED STATES PATENT AND TRADEMARK OFFICE
CERTIFICATE OF CORRECTION

PATENT NO. : 8,853,290 B2
APPLICATION NO. : 13/376951
DATED : October 7, 2014
INVENTOR(S) : Shihei Motofuji et al.

It is certified that error appears in the above-identified patent and that said Letters Patent is hereby corrected as shown below:

In the Claims,

Column 47 Lines 16 and 17

Change

"and $(X^9)^-$ to $(X^9)^-$ are"

To Be

--and $(X^9)^-$ to $(X^{12})^-$ are--

Signed and Sealed this
Nineteenth Day of May, 2015

Michelle K. Lee
*Director of the United States Patent and Trademark Office*